(12) United States Patent
Huang et al.

(10) Patent No.: US 10,692,754 B2
(45) Date of Patent: Jun. 23, 2020

(54) DEVICE AND METHOD FOR CONTACT STATE INSPECTION

(71) Applicant: TAIWAN SEMICONDUCTOR MANUFACTURING CO., LTD., Hsinchu (TW)

(72) Inventors: Yung-Chang Huang, Taichung (TW); Tsun-En Kuo, Taichung (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 16/151,184

(22) Filed: Oct. 3, 2018

(65) Prior Publication Data

US 2020/0020574 A1    Jan. 16, 2020

Related U.S. Application Data

(60) Provisional application No. 62/698,274, filed on Jul. 15, 2018.

(51) Int. Cl.
| | |
|---|---|
| *H01L 21/768* | (2006.01) |
| *H01L 21/321* | (2006.01) |
| *C25D 7/12* | (2006.01) |
| *C25D 3/38* | (2006.01) |
| *H01L 21/66* | (2006.01) |
| *H01L 21/67* | (2006.01) |

(52) U.S. Cl.
CPC ......... *H01L 21/76807* (2013.01); *C25D 3/38* (2013.01); *C25D 7/123* (2013.01); *H01L 21/3212* (2013.01); *H01L 21/6723* (2013.01); *H01L 21/76843* (2013.01); *H01L 21/76873* (2013.01); *H01L 21/76877* (2013.01); *H01L 22/12* (2013.01); *H01L 22/14* (2013.01)

(58) Field of Classification Search
CPC .... H01L 21/6835–21/68792; H01L 21/76807; H01L 21/67; H01L 21/768; C25D 17/001
See application file for complete search history.

(56) References Cited

U.S. PATENT DOCUMENTS 6,139,712 A * 10/2000 Patton ...................... C25D 7/12
205/137

* cited by examiner

*Primary Examiner* — Dale E Page
*Assistant Examiner* — Wilner Jean Baptiste
(74) *Attorney, Agent, or Firm* — Maschoff Brennan

(57) ABSTRACT

A method includes disposing a wafer in a cup of a clamshell of an electroplating apparatus. The wafer is clamped using the cup and a cone of the clamshell. First pressure forces of contacts of the cup applied by the wafer is detected. The first pressure forces are respective compared with corresponding predetermined pressure ranges.

20 Claims, 21 Drawing Sheets

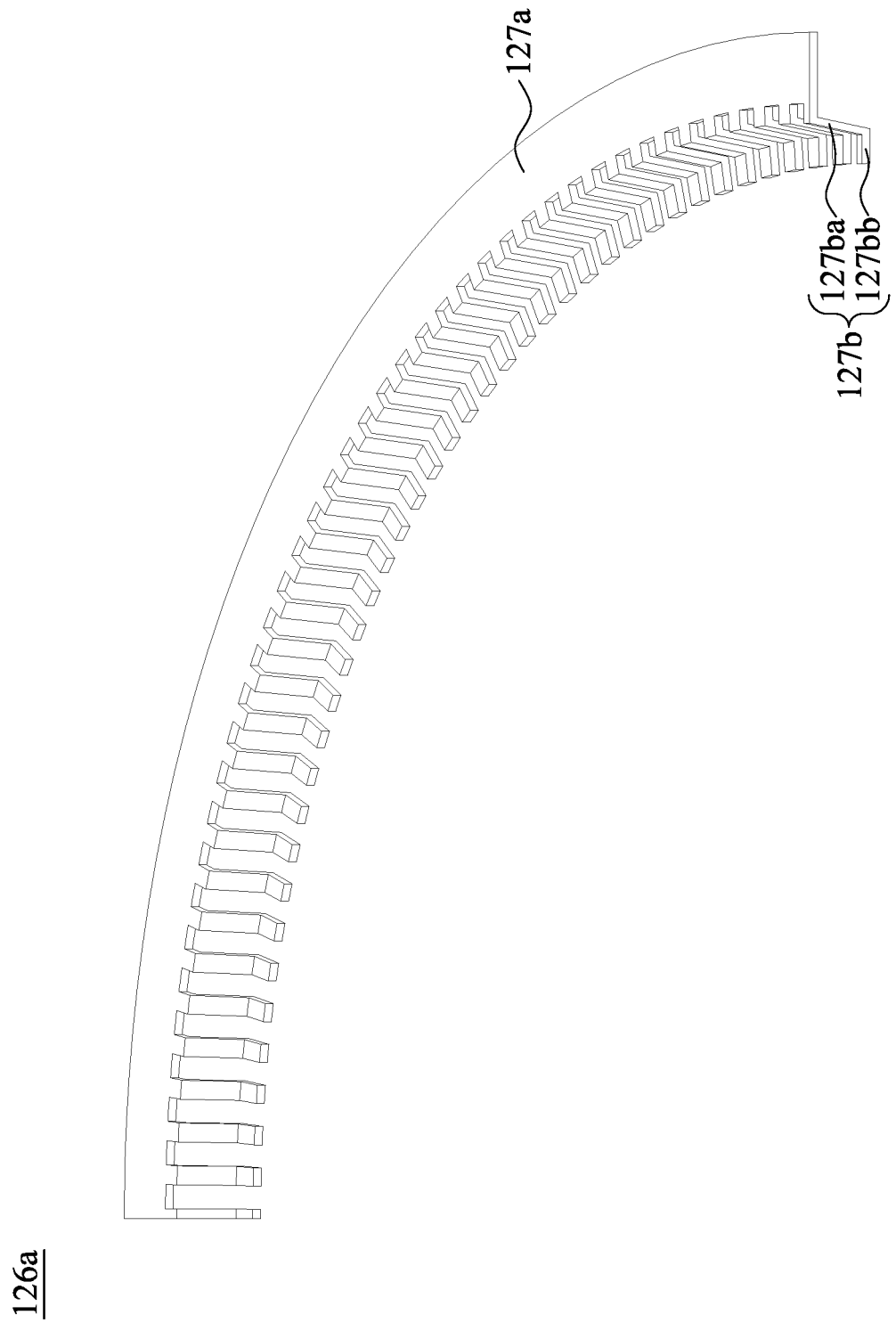

DEVICE AND METHOD FOR CONTACT STATE INSPECTION

PRIORITY CLAIM AND CROSS-REFERENCE

This application claims priority to U.S. Provisional Application Ser. No. 62/698,274, filed Jul. 15, 2018, which is herein incorporated by reference.

BACKGROUND

Electroplating is used in integrated circuit manufacturing processes to form electrically conductive structures. For example, in a copper damascene process, electroplating is used to form copper lines and vias within channels previously etched into a dielectric layer. In such a process, a seed layer of copper is first deposited into the channels and on the substrate surface via physical vapor deposition. Then, electroplating is used to deposit a copper layer over the seed layer such that the channels are filled. Excess copper is then removed by chemical mechanical polishing, thereby forming the individual copper features.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 6 is a local view of the electrical contact structure in FIG. 5.

DETAILED DESCRIPTION

Figure 1:
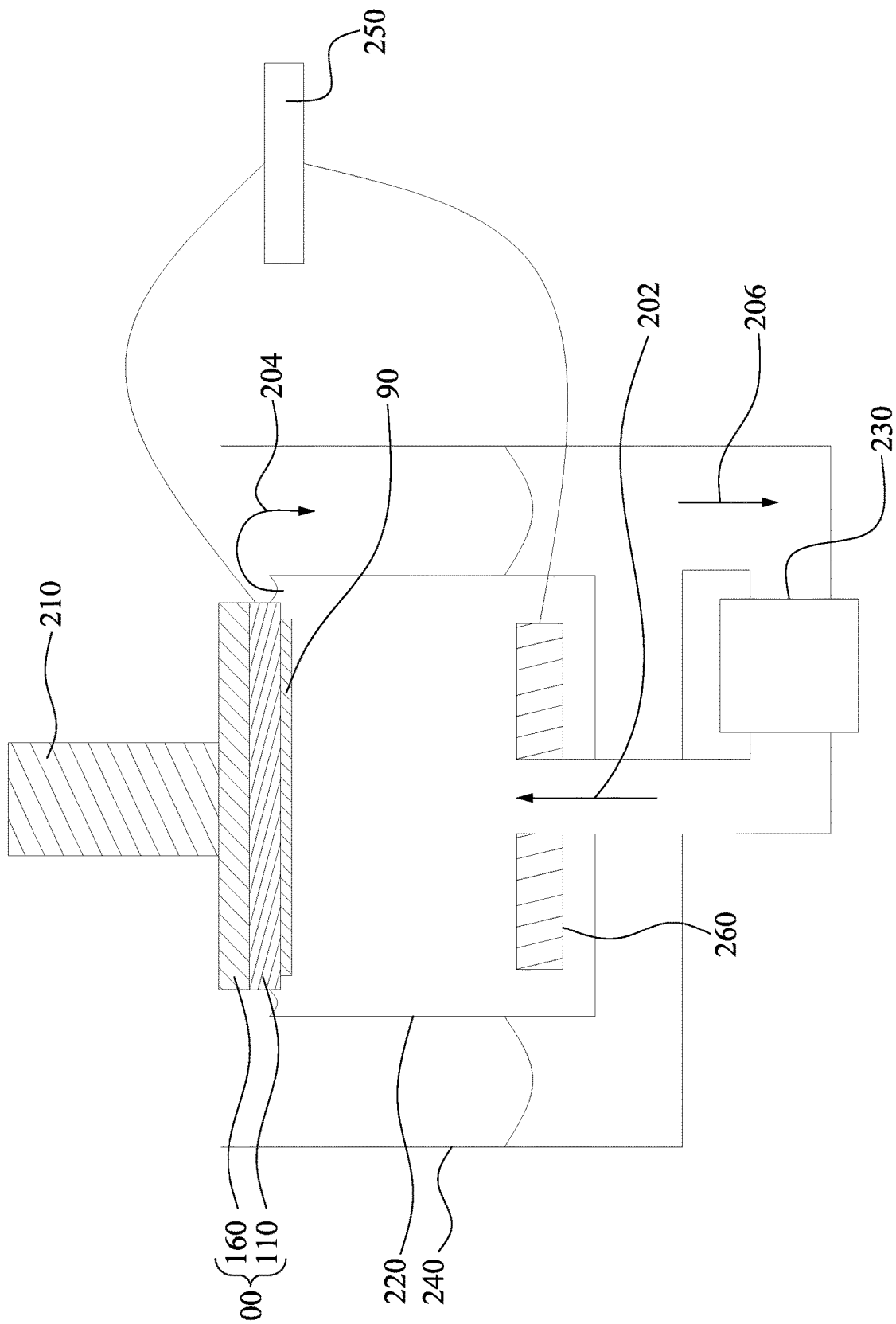
FIG. 1 is a diagrammatical view of an electroplating apparatus having a wafer mounted therein in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a diagrammatical view of an electroplating apparatus 10 having a wafer 90 mounted therein in accordance with some embodiments of the present disclosure. The electroplating apparatus 10 includes a clamshell 100 mounted on a rotatable spindle 210 which allows rotation of the clamshell 100. The clamshell 100 includes a cup 110 in which the wafer 90 is positioned during an electroplating process, and also a cone 160 that is lowered into the cup 110 to clamp the wafer 90 within the cup 110 during the electroplating process. Various cup and cone designs beyond those specifically depicted here can function in accordance with this disclosure. For example, the cup has an interior region in which the wafer 90 sits and the cone 160 presses the wafer 90 against a region of the cup 110 to hold it in place.

During the electroplating process cycle, the wafer 90 is mounted in the cup 110. The clamshell 100 and hence the wafer 90 are then placed in a plating bath 220 containing a plating solution. As indicated by the arrow 202, the plating solution is continually provided to the plating bath 220 by a pump 230. In some embodiments, the plating solution flows upwards to the center of the wafer 90 and then radially outward and across the wafer 90. By directing the plating solution towards the center of the wafer 90, gas bubbles entrapped on the wafer 90 are quickly removed. Gas bubble removal is further enhanced by rotating the clamshell 100 and hence the wafer 90. The plating solution then overflows the plating bath 220 to an overflow reservoir 240 as indicated by arrows 204. The plating solution is then filtered (not shown) and returned to the pump 230 as indicated by the arrow 206 completing the recirculation of the plating solution.

A DC power supply 250 has a negative output lead electrically connected to the wafer 90 through one or more slip rings, brushes and contacts (not shown). The positive output lead of the power supply 250 is electrically connected to an anode 260 located in the plating bath 220. During use, the power supply 250 biases the wafer 90 to have a negative potential relative to the anode 260 causing an electrical current to flow from the anode 260 to the wafer 90. (As used herein, electrical current flows in the same direction as the net positive ion flux and opposite the net electron flux.) This causes an electrochemical reaction (e.g. $Cu^{++}+2e^-=Cu$) on the wafer 90 which results in the deposition of the electrically conductive layer (e.g. copper) on the wafer 90. The ion concentration of the plating solution is replenished during the plating cycle, for example by dissolving a metallic anode (e.g. $Cu=Cu^{++}+2e^-$).

The depicted clamshell 100 is a closed contact system in which the cone 160 moves towards the cup 110 to together clamp the wafer 90. Upon clamping the cone 160 to the cup 110 and the wafer 90 before the electroplating process, contacts 127b (see FIG. 4) in the cup 110 contacts the wafer 90 to provide electrical signals to the wafer 90. The electroplating process may be failed or form a bad quality conductive layer on the wafer 90 if the contacts 127b are in poor contact with the wafer 90. As such, the clamshell 100 includes various features that help to inspect the states (broken or in the wrong position(s) relative to the wafer 90) of the contacts during or before the electroplating process.

Figure 2:
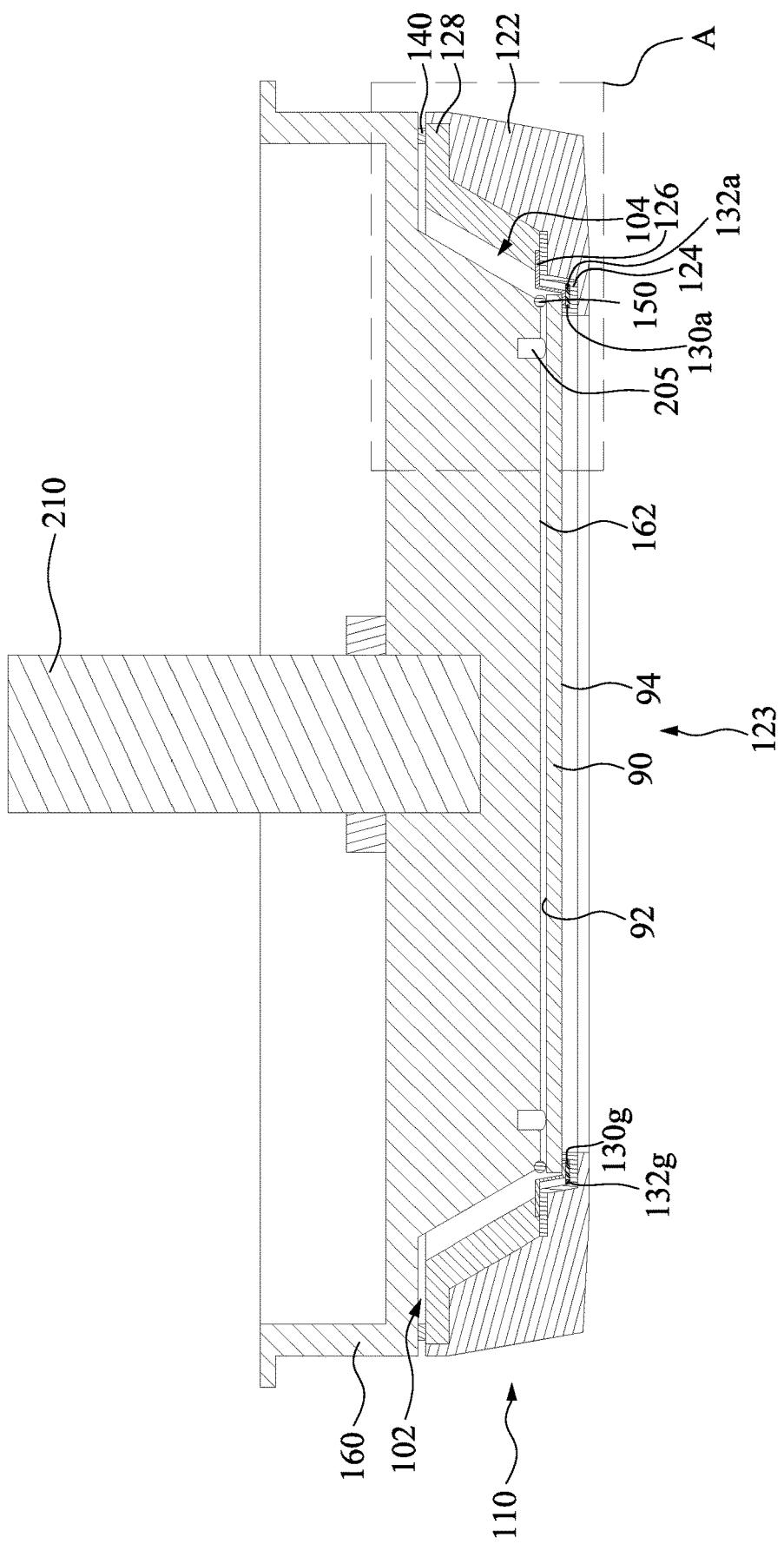
FIG. 2 is a cross-sectional view of the clamshell and the wafer of FIG. 1 in accordance with some embodiments of the present disclosure.
Figure 3:
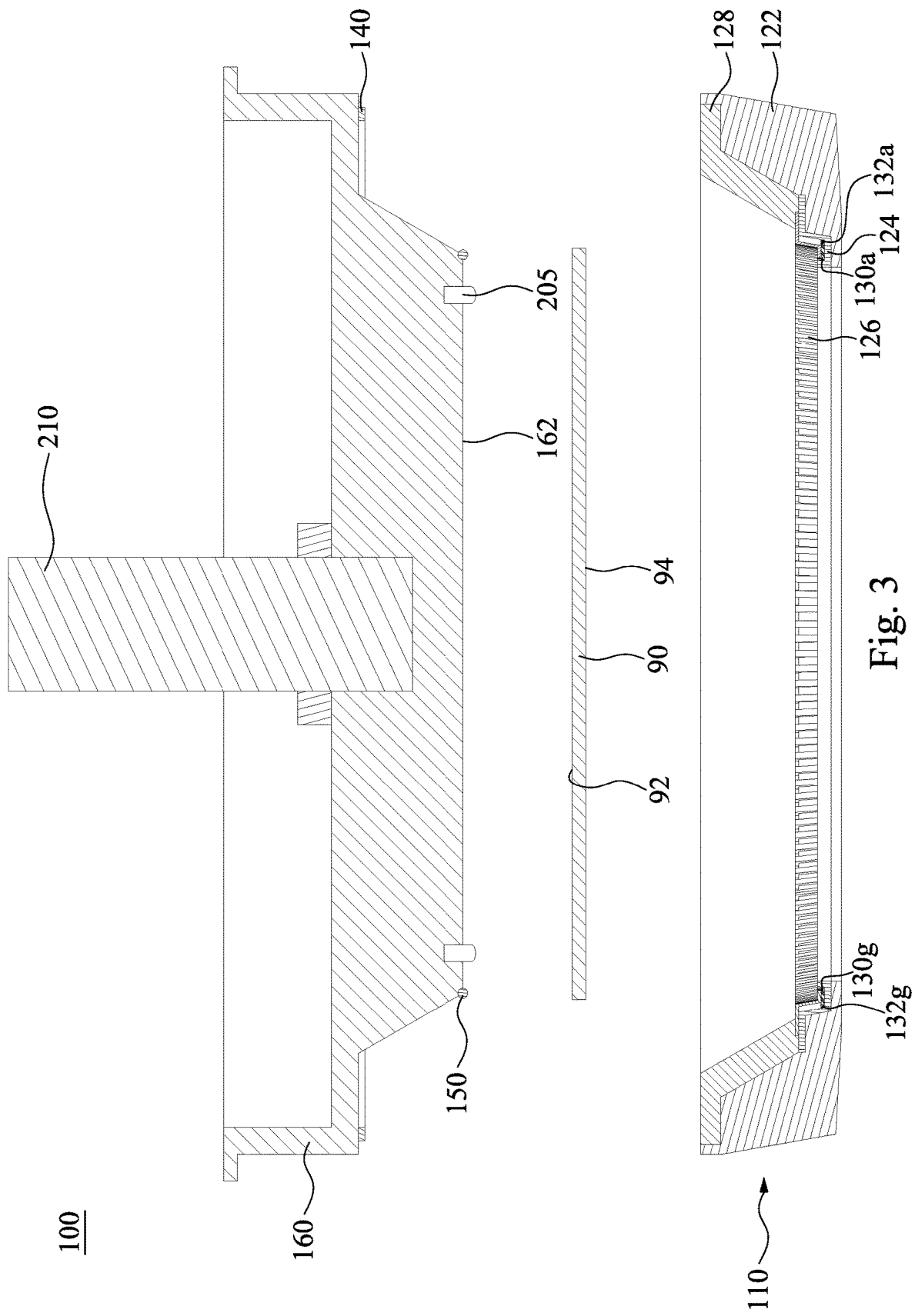
FIG. 3 is an exploded view of the clamshell and the wafer of FIG. 2.

FIG. 2 is a cross-sectional view of the clamshell 100 and the wafer 90 of FIG. 1 in accordance with some embodiments of the present disclosure. FIG. 3 is an exploded view of the clamshell 100 and the wafer 90 of FIG. 2. In FIG. 2, the clamshell 100 is in the closed position, i.e. the cone 160 is in abutting contact with the cup 110 and is in pressing contact with the backside 92 of the wafer 90. The cone 160 and the cup 110 are clamped together by pulling a vacuum in a region 102 between the cone 160 and the cup 110. An O-ring 140 is in the region 102 and between the cone 160 and the cup 110. The region 102 is evacuated by a vacuum line to clamp the cone 160 to the cup 110. The use of vacuum to clamp the cone 160 to the cup 110 ensures the two clamping surfaces remain flat and properly mated. In FIG. 3, the clamshell 100 is in the open position, i.e., the cone 160 is vertically separate from the cup 110.

Figure 4:
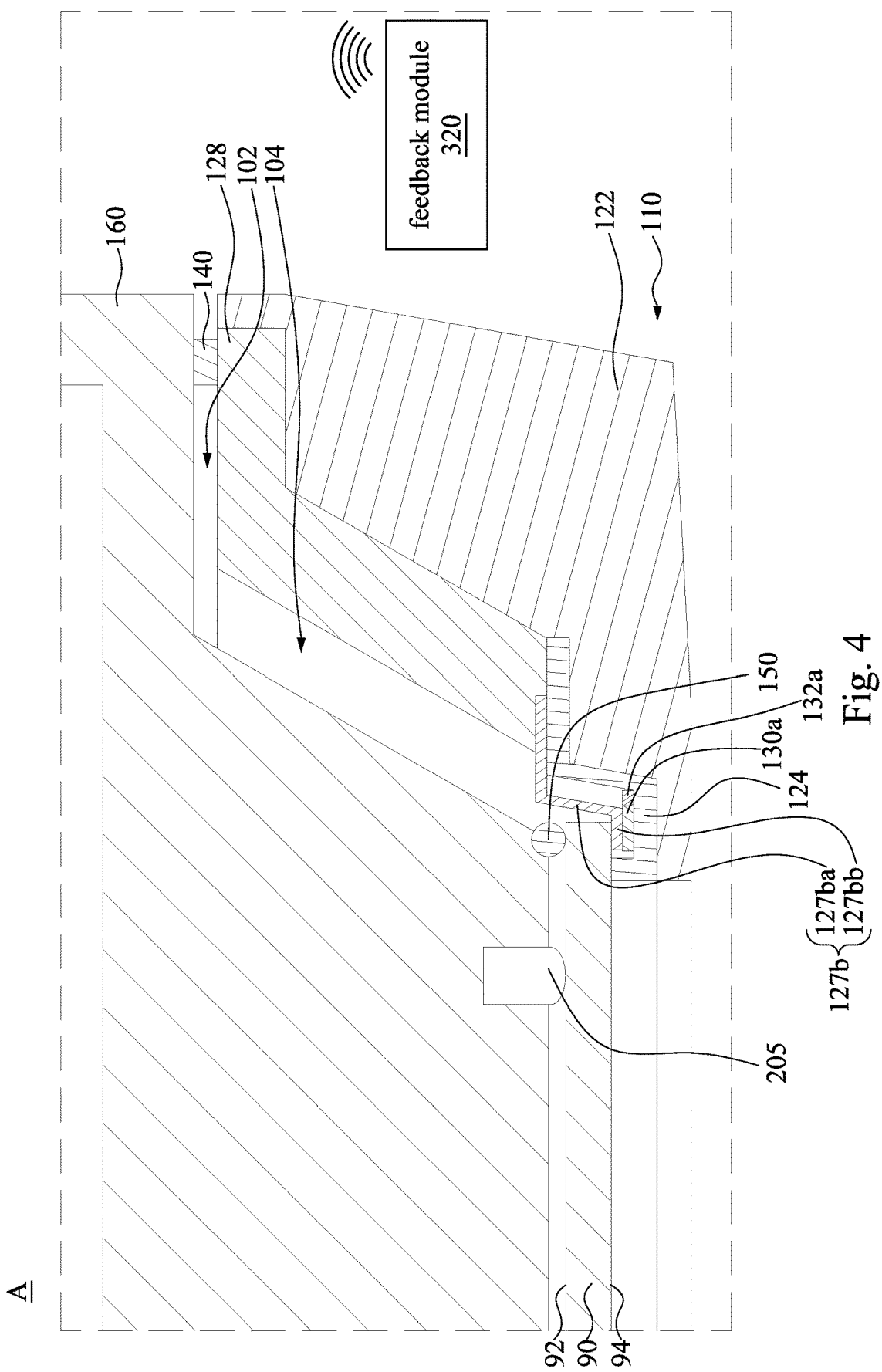
FIG. 4 is an enlarged cross-sectional view of a region of the clamshell in FIG. 2 in accordance with some embodiments of the present disclosure.
Figure 5:
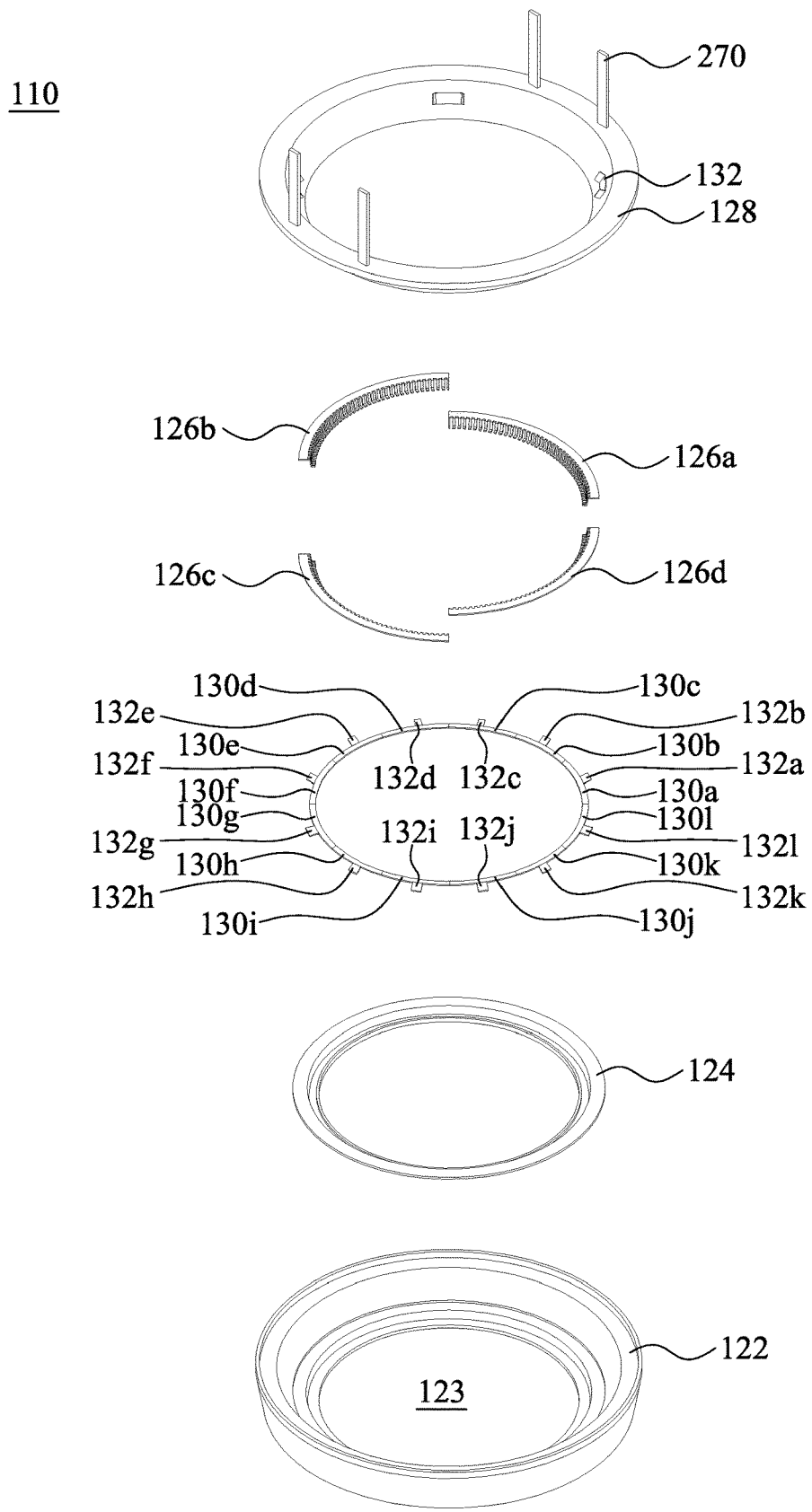
FIG. 5 is an exploded view of the cup in FIG. 2 according to some other embodiments.

FIG. 4 is an enlarged cross-sectional view of a region A of the clamshell 100 in FIG. 2 in accordance with some embodiments of the present disclosure, and FIG. 5 is an exploded view of the cup 110 in FIG. 2 according to some other embodiments. The cup 110 includes a cup bottom 122 that defines an opening 123 to allow exposure of the wafer 90 positioned in the cup 110 to the electroplating solution. A seal 124 is positioned on the cup bottom 122 around the opening 203 and is configured to form a seal against the wafer 90 to prevent plating solution from reaching the contacts located behind the seal 124.

The cup bottom 122 may be made from any suitable material. Suitable materials include materials capable of demonstrating high strength and stiffness at the thicknesses used for the cup bottom 122, and also that resist corrosion by low pH plating solutions, such as copper/sulfuric acid solutions. One specific non-limiting example of a suitable material is titanium.

The seal 124 also may be formed from any suitable material. Suitable materials include materials that do not react with or are not corroded by the acidic solutions used for plating, and of a sufficiently high purity not to introduce contaminants into the plating solution. Examples of suitable materials include, but are not limited to, perfluoro polymers. In some embodiments, the seal 124 may be coated with a hydrophobic coating. This may allow the seal 124 to shed aqueous plating solution when removed from a plating bath, and also may facilitate the removal of water from the seal 124 during a spin-rinse process.

The cup 110 further includes electrical contact structure(s) 126a-126d configured to form an electrically conductive connection between an external power supply and the wafer 90 positioned in the cup 110. The position of the electrical contact structure 126a is indicated in FIG. 4, and a general view of the electrical contact structures 126a-126d is shown in FIG. 5. As shown in these figures, the seal 124 is positioned between the electrical contact structures 126a-126d and the cup bottom 122, and thereby insulates the cup bottom 122 from the electrical contact structures 126a-126d. In some embodiments, the cup 122 includes a plurality of electrical contact structure 126a-126d. Each electrical contact structure 126a-126d is integral to a contact strip (e.g. see FIG. 6 described below) which is electrically isolated from the other electrical contact structures 126a-126d.

The electrical contact structures 126a-126d are electrically connected to a conductive ring 128 that rests on an outer portion of the electrical contact structures 126a-126d. The conductive ring 128 may also be referred to herein as a "bus bar". The depicted conductive ring 128 is configured as a continuous, thick ring of metal having an interior side that tapers inwardly, i.e. toward a center of the ring, in an axial direction from the top of the ring toward the bottom of the ring.

FIG. 6 is a local view of the electrical contact structure 126a in FIG. 5. Reference is made to FIGS. 4 and 6. The electrical contact structure 126a includes a continuous outer ring 127a that is positioned beneath and in contact with the conductive ring 128 to allow uniform distribution of current from the conductive ring 128 to the electrical contact structure 126a. The electrical contact structure 126a also includes a plurality of contacts 127b that extend from the outer ring 127a toward a center of the electrical contact structure 126a. Each contact 127b includes a portion 127ba that extends downwardly and inwardly from the outer ring 127a. Further, the downwardly and inwardly extending portion 127ba of each contact 127b is spaced from the seal 124. Each contact 127b also includes an upwardly turned end portion 127bb configured to contact the wafer 90 positioned in the cup 110. In this manner, each contact 127b acts as a leaf spring that is pushed against the plating surface 94 of the wafer 90 in the cup 110 with some spring force to ensure good contact between the contact 127b and the wafer 90. The configuration of the electrical contact structures 126b-126d are similar to that of the electrical contact structure 126a, and a description in this regard will not be repeated hereinafter.

Reference is made to FIGS. 4 and 5. In some embodiments, the contacts 127b may be broken or in a poor contact with the wafer 90. As such, the inspection feature mentioned above can be added into the cup 110 to inspect the contact states in real time. For example, the cup 110 includes a plurality of pressure sensors 130a-130l disposed between the contacts 127b and the seal 124. The pressure sensor has a press detection function for measuring the pressure of external force applied to a surface (also referred to as a pressing force). In some embodiments, the pressure sensor can be a resistive pressure sensor. The resistive pressure sensor converts the mechanical pressure value into a proportional electrical signal. The pressure sensor may include a stable main body and a (thin) diaphragm. The diaphragm is equipped with strain-sensitive and compression-sensitive resistance structures, so-called strain gauges (DMS). The diaphragm is deflected under the influence of pressure. Thus, the strain gauges attached to it are elongated or compressed and its electrical resistance changes. This change in resistance is substantially proportional to the pressure. It is noted that other types of the pressure sensors can be applied to the clamshell 100.

Specifically, the pressure sensors 130a-130l are disposed between the portions 127bb of the contacts 127b and the seal 124. The pressure sensors 130a-130l are arranged as a circle. The pressure sensors 130a-130c are disposed between the electrical contact structure 126a and the seal 124, the pressure sensors 130d-130f are disposed between the electrical contact structure 126b and the seal 124, the pressure sensors 130g-130i are disposed between the electrical contact structure 126a and the seal 124, and the pressure sensors 130j-130l are disposed between the electrical contact structure 126d and the seal 124. In some embodiments, the pressure sensors 130a-130l are in abutting contact with each other as shown in FIG. 5. In some other embodiments, the pressure sensors 130a-130l are separated from each other, and the space between adjacent two pressure sensors 130a-130l are smaller than a space between adjacent two contacts 127b. As such, all states of the contacts 127b can be inspected by the pressure sensors 130a-130l when the wafer 90 presses the contacts 127b. It is noted that the number of the pressure sensors shown in FIG. 5 is for illustrative purposes and should not limit the present disclosure. Embodiments fall within the present disclosure if the number of the pressure sensors is greater than one.

Figure 7C:
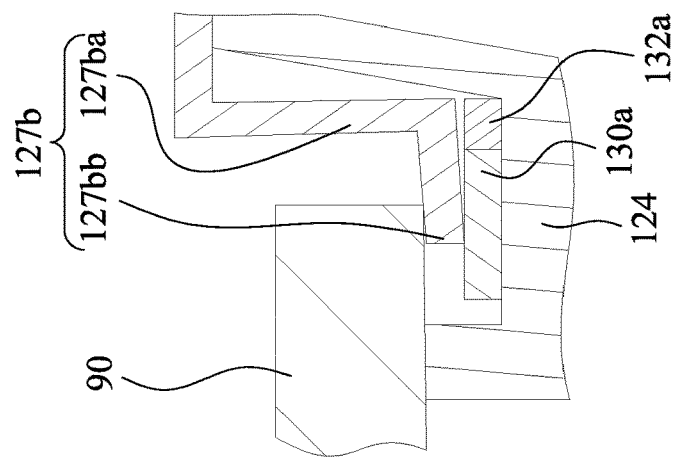
FIGS. 7A-7C are enlarged cross-sectional views of the contacts, the pressure sensor, the seal, and the wafer according to different embodiments.
Figure 7B:
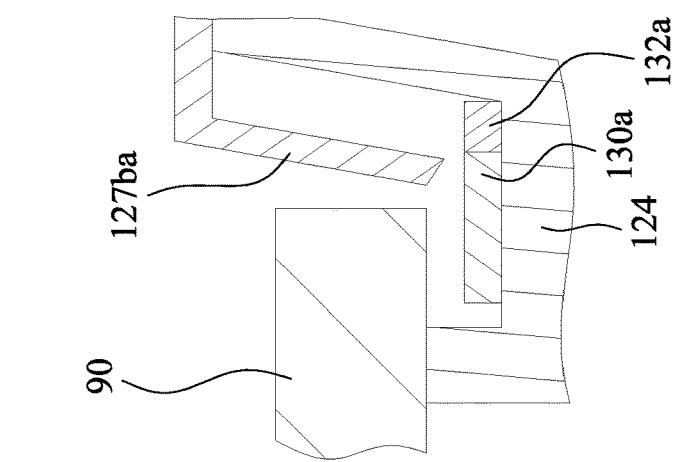
Figure 7A:
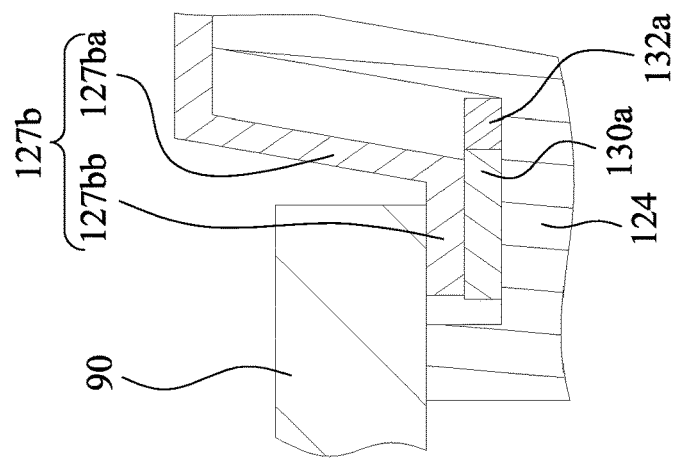

FIGS. 7A-7C are enlarged cross-sectional views of the contacts 127b, the pressure sensor 130a, the seal 124, and the wafer 90 according to different embodiments. It is noted that a single contact 127b is illustrated in each figure for clarity. In FIG. 7A, which is a good contact state of the contact 127b, the wafer 90 presses the contact 127b, and the contact 127b presses the pressure sensor 130a. As such, the pressure sensor 130a senses the pressure force applied by the contact 127b, and this pressure force may be referred as a predetermined pressure value. In FIG. 7B, the contact 127b is broken, e.g., the portion 127bb (see FIG. 7A) is missing. The wafer 90 can not touch the contact 127b when the wafer 90 presses downwardly. As such, the pressure sensor 130a can not sense the pressure force, and the pressure force sensed by the pressure sensor 130a is lower than the predetermined pressure value. In FIG. 7C, the contact 127b is in the wrong position, e.g., the contact 127b may be twisted to the wrong position. As such, when the wafer 90 presses the contact 127b, the contact area between the wafer 90 and the portion 127bb is reduced (compared to the good state shown in FIG. 7A), and the pressure sensor 130a senses a pressure force, which is beyond the predetermined pressure range (may be lower or higher than the predetermined pressure range). Hence, by sensing the pressure forces applied by the contact 127b to the pressure sensor 130a, the state of the contact 127b (which is in a good state in FIG. 7A and in bad states in FIGS. 7B and 7C) can be determined. In some embodiments, the predetermined pressure range may be about 5 mohm to about 40 mohm, and the present disclosure is not limited in this regard.

Reference is made to FIGS. 4 and 5. For good contact states (i.e., all of the contacts 127b are in good contact with the wafer 90 as shown in FIG. 7A), when the cone 160 presses the wafer 90, the wafer 90 touches the contacts 127b, and the contacts 127b move downwardly to touch the pressure sensors 130a-130l. The pressure sensors 130a-130l sense pressure forces when the cone 160 presses the wafer 90. The contacts 127b are considered as in good states if the pressure forces sensed by the pressure sensors 130a-130l are respectively in predetermined pressure values or ranges. After the contacts 127b are determined as in good states, an electroplating process can be performed in the following stage.

For bad contact states (i.e., at least one of the contacts 127b is in bad contact with the wafer 90 as shown in FIGS. 7B and 7C), the corresponding pressure sensor (e.g., the pressure sensor 130a in the cases of FIGS. 7B and 7C) senses a pressure force beyond than the predetermined pressure range. As such, the position of the bad-state contact 127b, which is above the pressure sensor 130a, can be detected, and a contact replacement process can be performed in the following stage. For example, the electrical contact structure 126a disposed above the pressure sensor 130a is replaced with another electrical contact structure. With the inspection method mentioned above, not only the states of the contacts 127b can be determined, but also the position(s) of the bad-state contacts 127b can be detected. As such, the bad electrical contact structure (e.g., the bad electrical contact structure 126a in FIGS. 7B and 7C cases) can be removed without affecting the other good electrical contact structures (e.g., the good electrical contact structure 126b-126d in FIGS. 7B and 7C cases).

Reference is made to FIG. 4. The clamshell 100 may further include a feedback module 320 in electrically communication to the pressure sensors 130a-130l to receive the detected pressure forces of the pressure sensors 130a-130l and provide a notification if at least one of the pressure sensors 130a-130l has a pressure force beyond the predetermined pressure range. For example, the feedback module 320 provides a visual signal (onto a display), and an operator may perform a contact replacement process if the operator receives the visual signal. In some other embodiments, other kinds of notifications can be applied to the feedback module 320.

Reference is made to FIGS. 4 and 5. In some embodiments, the feedback module 320 and the pressure sensors 130a-130l are in electrically communication in a wireless manner. That is, the feedback module 320 remotely receives the data (i.e., the pressure forces) of each of the pressure sensors 130a-130l. Hence, the clamshell 100 further includes a plurality of transmitters 132a-132l respectively connected to the pressure sensors 130a-130l. The transmitters 132a-132l respectively receive the data of the pressure sensors 130a-130l and then send the data to the feedback module 320. In some embodiments, the transmitters 132a-132l are disposed on the seal 124, between the pressure sensors 130a-130l and the seal 124, and respectively adjacent to the pressure sensors 130a-130l. However, the transmitters 132a-132l can be disposed at other positions as long as the transmitters 132*a*-132*l* are respectively connected to the pressure sensors 130*a*-130*l*.

In some other embodiments, the feedback module 320 and the pressure sensors 130*a*-130*l* are electrically connected by using wires. The wires respectively interconnect the pressure sensors 130*a*-130*l* and the feedback module 320. Hence, the data of each of the pressure sensors 130*a*-130*l* can be sent to the feedback module 320 through the wires. In some embodiments, one or some of the pressure sensors 130*a*-130*l* can be electrically connected to the feedback module 320 in a wireless manner, and the rest of the pressure sensors 130*a*-130*l* are electrically connected to the feedback module 320 by using wires.

Figure 8C:
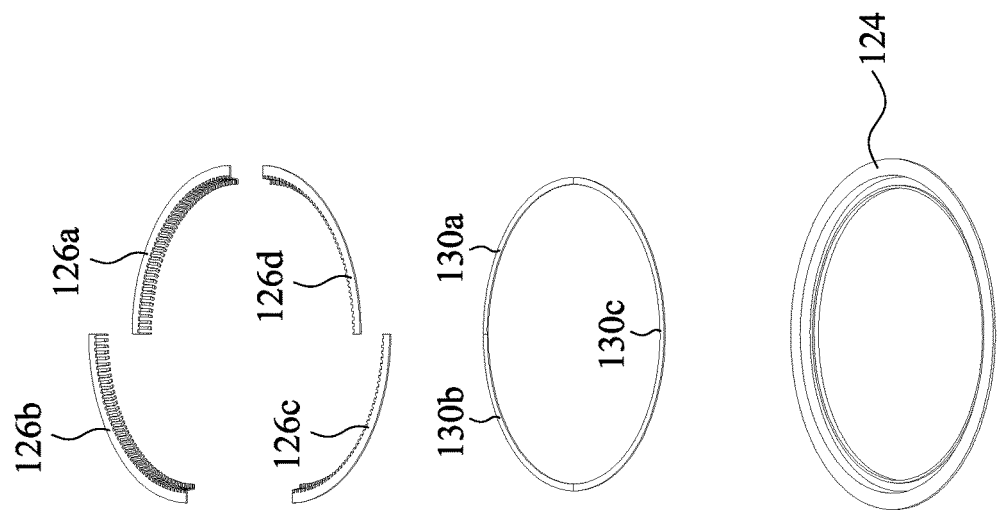
FIGS. 8A-8C are exploded views of electrical contact structures, pressure sensors, and seals according to different embodiments.
Figure 8B:
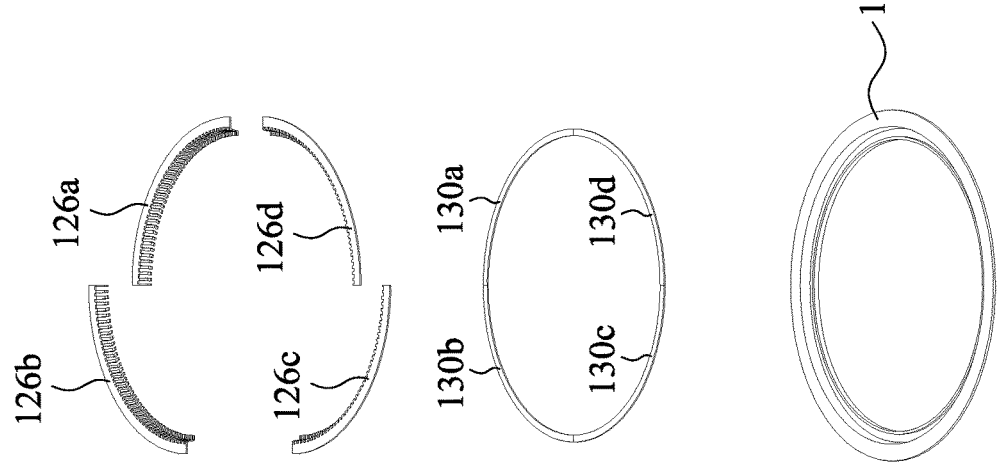
Figure 8A:
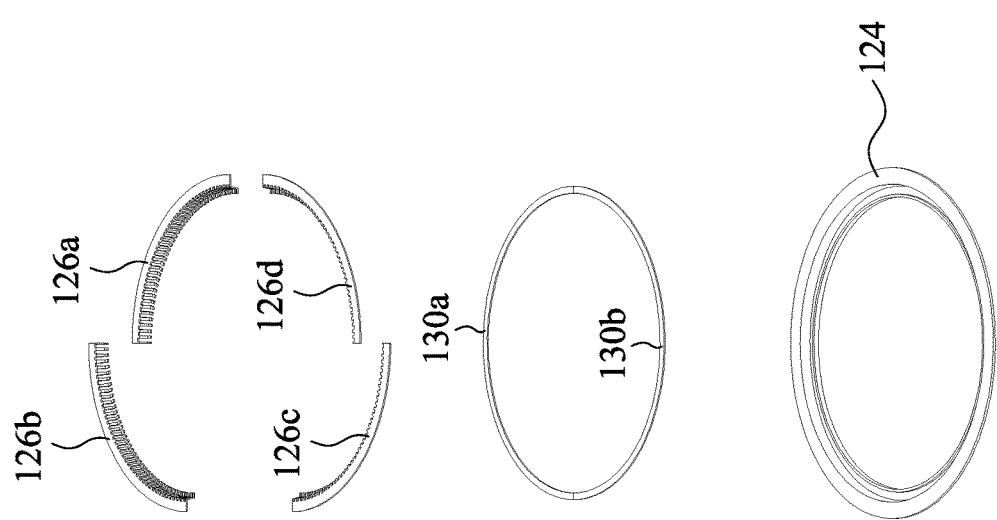

FIGS. 8A-8C are exploded views of electrical contact structures 126*a*-126*d*, pressure sensors, and seals 124 according to different embodiments. For clarity, the transmitters or wires connected to the pressure sensors are not shown in FIGS. 8A-8C. In FIG. 8A, the cup 110 (see FIG. 5) includes two pressure sensors 130*a* and 130*b*. The pressure sensor 130*a* is disposed between the electrical contact structures 126*a*-126*b* and the seal 124, and the pressure sensor 130*b* is disposed between the electrical contact structures 126*c*-126*d* and the seal 124. As such, the pressure sensor 130*a* is able to determine the contact states of the contacts 127*b* of the electrical contact structures 126*a*-126*b*, and the pressure sensor 130*b* is able to determine the contact states of the contacts 127*b* of the electrical contact structures 126*c*-126*d*. In FIG. 8B, the cup 110 includes four pressure sensors 130*a*-130*d*. The pressure sensor 130*a* is disposed between the electrical contact structure 126*a* and the seal 124, the pressure sensor 130*b* is disposed between the electrical contact structure 126*b* and the seal 124, the pressure sensor 130*c* is disposed between the electrical contact structure 126*c* and the seal 124, and the pressure sensor 130*d* is disposed between the electrical contact structure 126*d* and the seal 124. As such, the pressure sensors 130*a*-130*d* are able to respectively determine the contact states of the contacts 127*b* of the electrical contact structures 126*a*-126*d*. In FIG. 8C, the cup 110 includes three pressure sensors 130*a*-130*c*. The pressure sensor 130*a* is disposed between the electrical contact structure 126*a* and the seal 124, the pressure sensor 130*b* is disposed between the electrical contact structure 126*b* and the seal 124, and the pressure sensor 130*c* is disposed between the electrical contact structures 126*c*-126*d* and the seal 124. As such, the pressure sensor 130*a* is able to determine the contact states of the contacts 127*b* of the electrical contact structure 126*a*, the pressure sensor 130*b* is able to determine the contact states of the contacts 127*b* of the electrical contact structure 126*b*, and the pressure sensor 130*c* is able to determine the contact states of the contacts 127*b* of the electrical contact structures 126*c*-126*d*. Furthermore, the pressure sensors have the same or different sensing area(s). For example, the pressure sensors 130*a*-130*b* in FIG. 8A have substantially the same sensing area, the pressure sensors 130*a*-130*d* in FIG. 8B have substantially the same sensing area, and the pressure sensors 130*a*-130*c* in FIG. 8C have different sensing areas. It is noted that the arrangements of the pressure sensors in FIGS. 8A-8C (and FIG. 5) are illustrative and should not limit the present disclosure. The term "substantially" as used herein may be applied to modify any quantitative representation which could permissibly vary without resulting in a change in the basic function to which it is related.

Reference is made to FIGS. 2 and 4. By clamping the cone 160 to the cup 110, a pressing surface 162 of the cone 160 presses against the backside 92 of the wafer 90. This forces the perimeter region of plating surface 94 of the wafer 90 against the cup 110. As a secondary measure to prevent contamination of the backside 92 of the wafer 90, an O-ring 150 is located in a channel of the pressing surface 162 of the cone 110. The O-ring 150 extends beyond the plane defined by the pressing surface 162 and is interposed between the cone 160 and the backside 92 of the wafer 90. A resulting region 104 is pressurized with a gas from a compressed gas line (not shown), may be dry air or an inert gas such as argon or nitrogen. More particularly, the region 104 (a cavity) is defined by the cone 160, the cup 110, the wafer 90, and the O-rings 140 and 150. The O-ring 150 prevents the pressurized gas in the region 104 from contacting most of the backside 92 of the wafer 90 and thus eliminates any possible damage to the wafer 90 from the pressurized gas. Further, by pressurizing the region 104, any inadvertent leak in the seal formed between the plating surface 94 of the wafer 90 and the cup 110 results in the escape of pressurized gas from the region 104 into the plating solution, i.e. prevents the plating solution from entering into the region 104 and contaminating the backside 92 of the wafer 90. The clamshell 100 further includes plungers 205 which extend from the cone 160 beyond the pressing surface 162 of the cone 160. The plungers 205 may be springs. When the clamshell 100 is in the closed position, the plungers 205 are also retracted into the cone 160 and press on the backside 92 of the wafer 90. After the electroplating processing, the clamshell 100 is raised from the plating solution and the procedure described above is reversed to unload the wafer 90. The plungers 205 prevent the wafer 90 from sticking to the cone 160 when the clamshell 100 is opened.

Reference is made to FIG. 5. The cup 110 further includes a wafer centering mechanism configured to hold the wafer 90 in a correct location within the cup 110. The depicted wafer centering mechanism includes a plurality of leaf springs 132 positioned around an inside of the conductive ring 128. Each leaf spring 132 includes a pair of downwardly-extending ends that contact an edge of the wafer 90 positioned in the cup 110. The spring forces exerted by each leaf spring 132 balance to hold the wafer 90 in a correct position relative to the seal 124, the electrical contact structure 126, etc.

Figure 9:
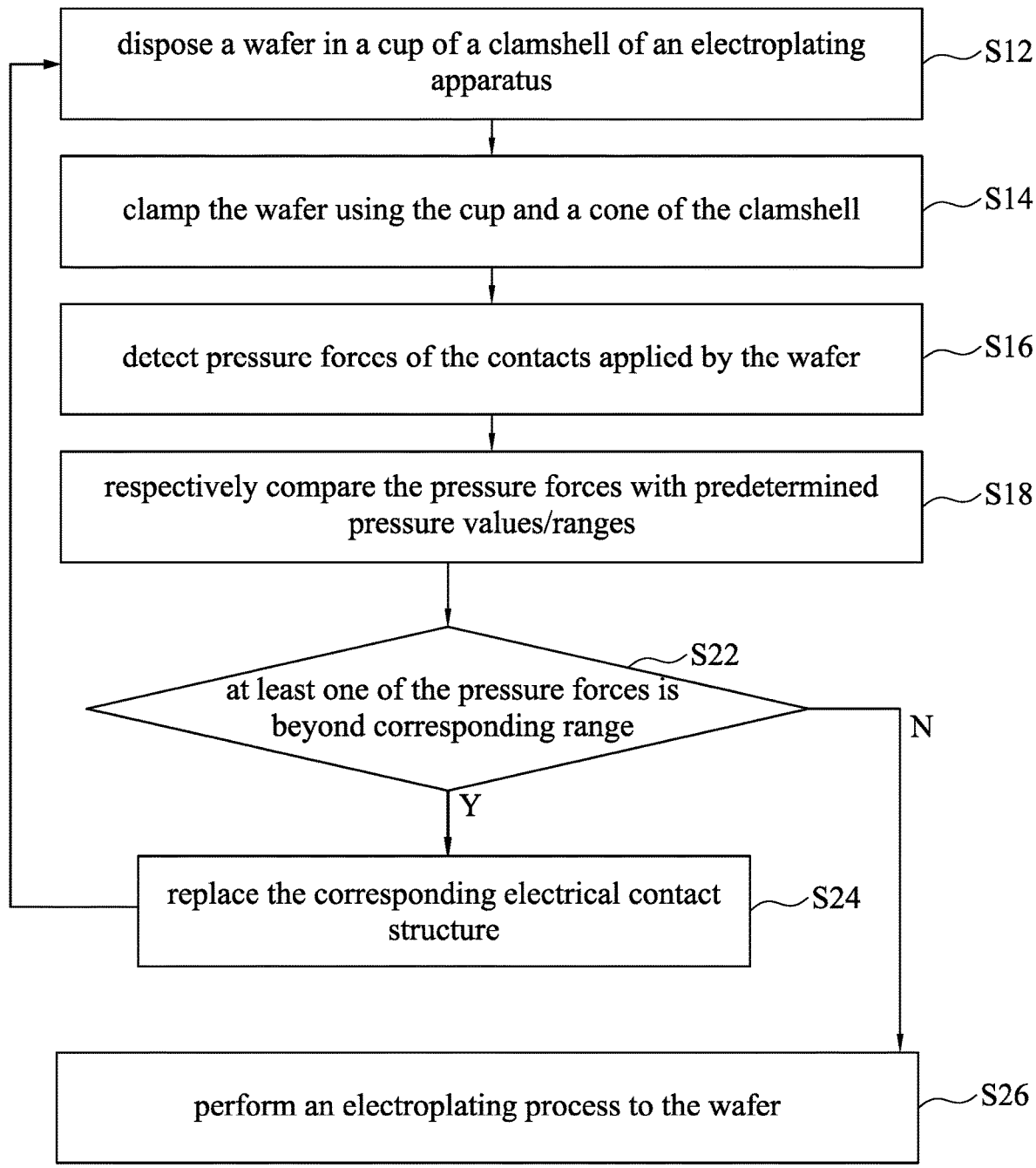
FIG. 9 is a flow chart of a method for inspecting the states of the contacts according to some embodiments.

FIG. 9 is a flow chart of a method M10 for inspecting the states of the contacts according to some embodiments. The method M10 is merely an example and is not intended to limit the present disclosure beyond what is explicitly recited in the claims. Additional operations can be provided before, during, and after the method M10, and some operations described can be replaced, eliminated, or moved around for additional embodiments of the process. For clarity and ease of explanation, some elements of the figures have been simplified.

Method M10 includes operation S12: disposing a wafer in a cup of a clamshell of an electroplating apparatus. The wafer 90 is disposed in the cup 110 with its plating surface 94 facing downwardly as shown in FIG. 2. The contacts 127*b* (see FIG. 6) of the cup 110 is in contact with the plating surface 94 when the wafer 90 is disposed in the cup 110. In some embodiments, one or some contact(s) 127*b* may be broken or in a bad contact with the wafer 90 (as shown in FIGS. 7B and 7B).

The method M10 of FIG. 9 further includes operation S14: clamping the wafer using the cup and a cone of the clamshell. In some embodiments, as shown in FIG. 2, the cone 160 presses the wafer 90 downwardly, such that the cone 160 and the cup 110 together clamp the wafer 90, and the wafer 90 touches the contacts 127*b*.

The method M10 of FIG. 9 further includes operation S16: detecting pressure forces of the contacts applied by the wafer. In some embodiments, the method M10 detects the pressure forces applied by the wafer against the contacts, and the pressure forces of the contacts are detected by the pressure sensors 130a-130l in FIG. 5, 8A, 8B, or 8C.

The method M10 of FIG. 9 further includes operation S18: respectively comparing the pressure forces with predetermined pressure values/ranges. In some embodiments, each of the pressure sensors has a predetermined pressure value/range, which represents a pressure force applied by good-state contacts. When the wafer presses the contacts, each of the pressure sensors senses a pressure force. The feedback module receives the pressure forces of the pressure sensors and compare these pressure forces with the predetermined pressure values/ranges.

The method M10 of FIG. 9 further includes operation S22: the feedback module will provide a notification when the pressure force of at least one of the pressure sensors is beyond the corresponding predetermined pressure range. The notification indicates which pressure sensor senses the smaller pressure force, and an operator can identify which electrical contact structure is going to be replaced.

The method M10 of FIG. 9 further includes operation S24: the corresponding electrical contact structure is replaced with another electrical contact structure. For example, the cone of the clamshell is lifted, and the wafer is removed from the clamshell. The cup is dissembled to replace the electrical contact structure (with bad contact(s)). After the electrical contact structure is replaced, the cup is assembled again. The method M10 is back to the operation S12.

In some other embodiments, if all the pressure force of the pressure sensors are in the corresponding predetermined pressure value/range, then the operation S22 moves to the operation S26: performing an electroplating process to the wafer. For example, the clamshell with the wafer can be disposed in the plating solution of the plating bath to process the electroplating process. With such inspection method, the clamshell can permit the contacts are in good contact with the wafer in real time, and the yield of the wafer can be improved.

Figure 10:
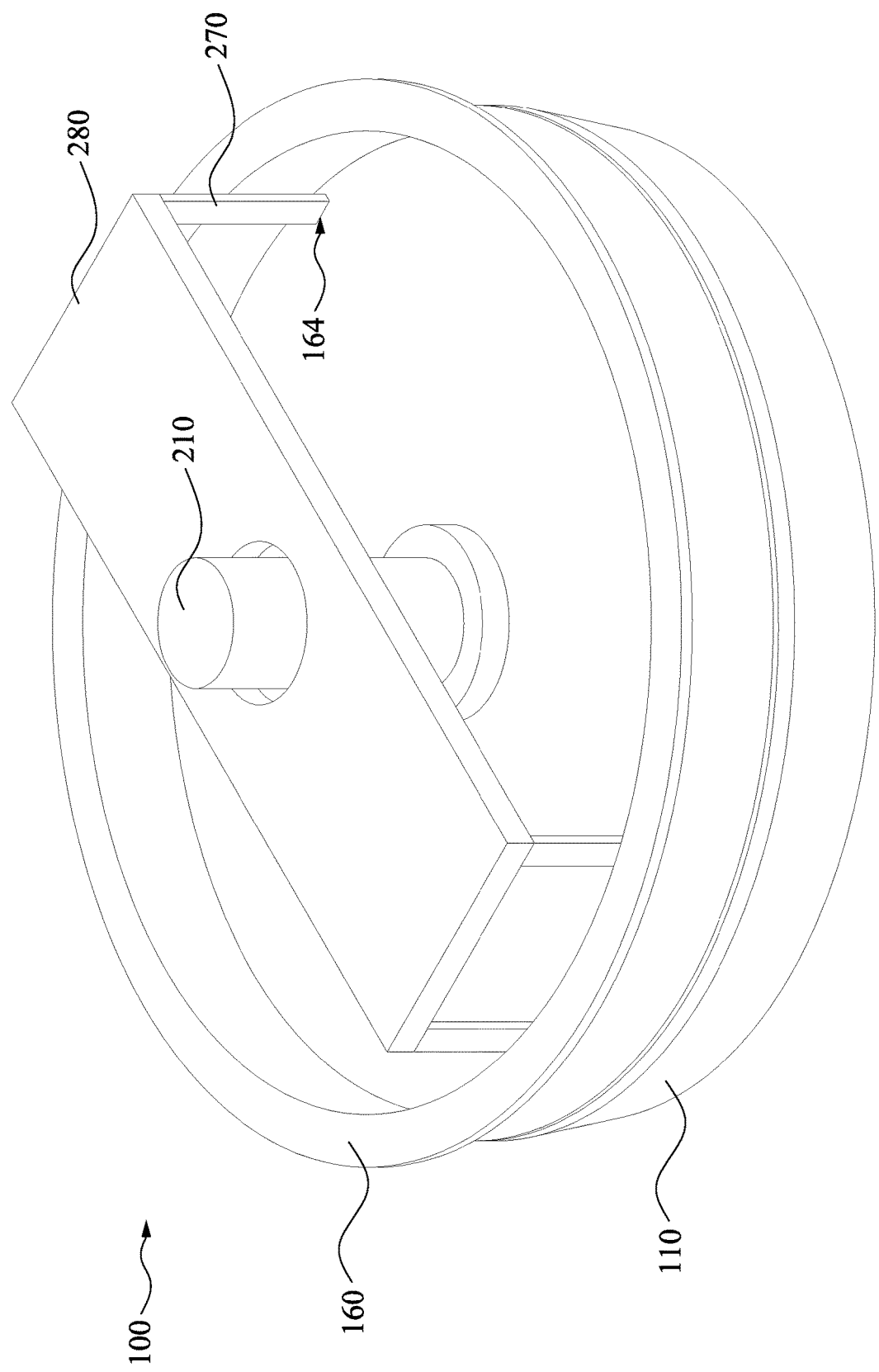
FIG. 10 is a perspective view of the clamshell and the spindle of the electroplating apparatus of FIG. 1 according to some embodiments.

FIG. 10 is a perspective view of the clamshell 100 and the spindle 210 of the electroplating apparatus 10 of FIG. 1 according to some embodiments. The cup 110 is fixedly attached to the spindle 210 by struts 270 and a top plate 280. The cone 160 is attached to a shaft extending into the spindle 210 and thereby to spindle. The cone 160 is capable of vertical movement relative to the shaft by an air actuated cylinder.

Reference is made to FIGS. 5 and 10. An electrical connection is made to the conductive ring 128 of the cup 110 through the struts 270 that extend from a top surface of the conductive ring 128. The struts 270 are made from an electrically conductive material, and act as a conductor through which electrical current reaches the conductive ring 128. In some embodiments, the struts 270 may be coated with an insulating coating. The struts 270 also structurally connect the cup 110 to a vertical drive mechanism (not shown) that allows the cup 110 to be lifted from and lowered into a plating solution, and also connect the cup 110 to a rotational drive mechanism.

In some embodiments, the aforementioned inspection method may further include an operation: determining the predetermined pressure values/ranges of the pressure sensors (see FIG. 9). In some embodiments, when the wafer 90 is clamped by the cone 160 and the cup 110, i.e., the wafer 90 presses the contacts 127b, an electrical signal is applied to the electrical contact structures 126a-126d. The electrical signal may be provided by the DC power supply 250 (see FIG. 1), and the electrical signal passes through the top plate 280, the struts 270, and the conductive ring 128 to the electrical contact structures 126a-126d. The top plate 280 is then receive the feedback electrical signal (such as the electrical resistance) of the contacts 127b and compare this feedback electrical signal to a standard feedback electrical value. If the feedback electrical signal is substantially consistence with the standard feedback electrical value, then all the contacts 127b of the electrical contact structures 126a-126d are determined to be in good states. In this situation, the pressure forces of the pressure sensors 130 are sensed and then stored as the predetermined pressure values/ranges. It is noted that although the top plate 280 can also inspect the states of the electrical contact structures 126a-126d, the feedback electrical signal includes the data of all the contacts 127b, and the position of the bad-state contact 127b can not be inspected. Furthermore, for a huge amount of the contacts, e.g., more than 1000 contacts included in the electrical contact structures 126a-126d, one or few bad-state contacts 127b may not be inspected successfully. In contrary, each of the pressure sensors 130 sensors the pressure forces of few contacts 127b, such that the accuracy of the inspection can be improved.

Figure 11:
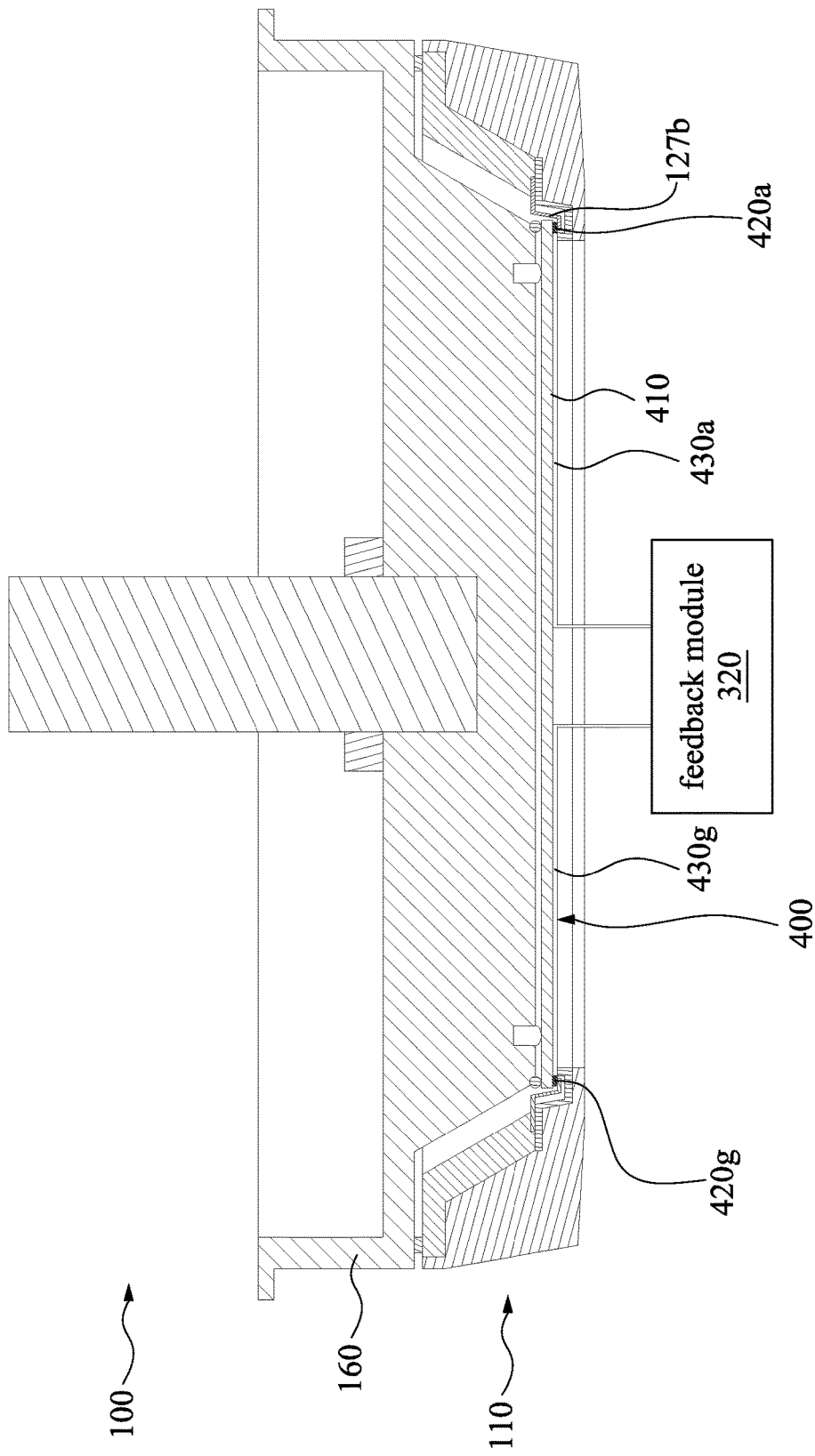
FIG. 11 is a cross-sectional view of the clamshell of FIG. 1 and a contact state inspection element in accordance with some embodiments of the present disclosure.
Figure 12:
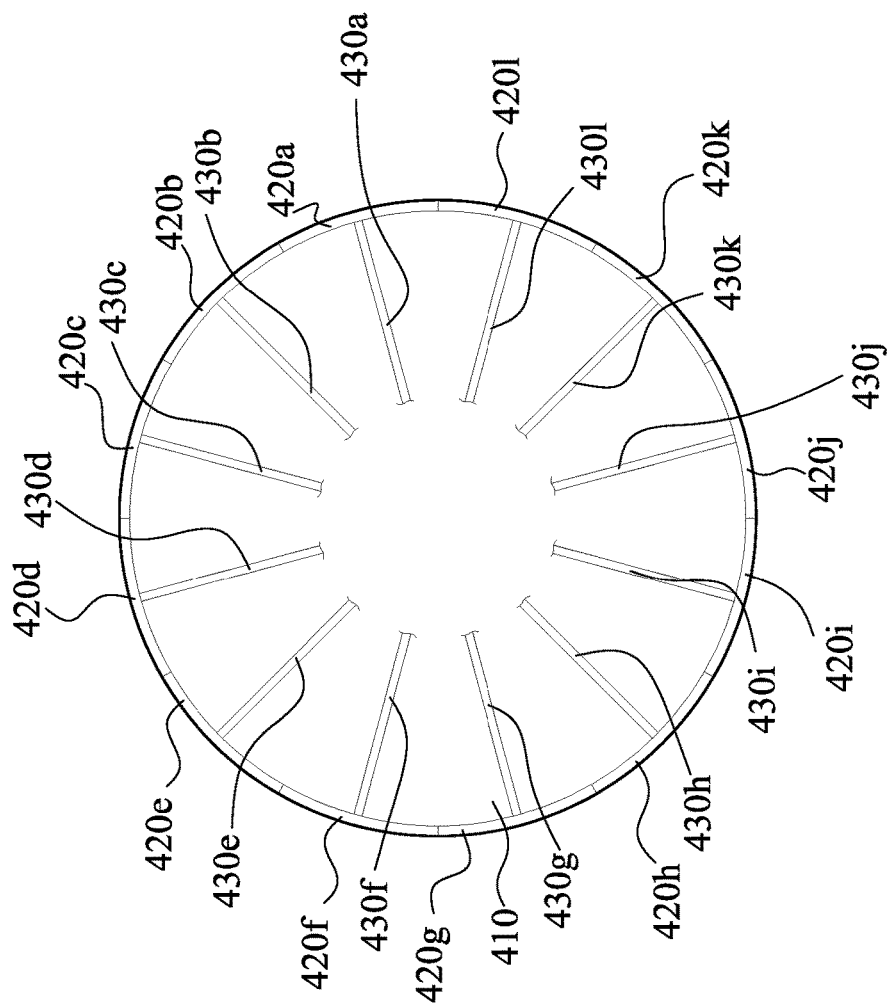
FIG. 12 is a bottom view of the contact state inspection element in FIG. 11.

FIG. 11 is a cross-sectional view of the clamshell 100 of FIG. 1 and a contact state inspection element 400 in accordance with some embodiments of the present disclosure, and FIG. 12 is a bottom view of the contact state inspection element 400 in FIG. 11. In some embodiments, the contact state inspection element 400 can inspect the states of the contacts 127b in advance (before disposing the wafer in the cup 110). Specifically, the contact state inspection element 400 includes a substrate 410 and a plurality of pressure sensors 420a-420l disposed on the substrate 410. The substrate 410 may have a size similar to that of the wafer that is configured to be performed the electroplating process. In some embodiments, the substrate 410 may be made of transparent materials, such as glass or plastic. In some other embodiments, the substrate 410 may be made of opaque materials. The pressure sensors 420a-420l are arranged as a circle in some embodiments. In some embodiments, the pressure sensors 420a-420l are in abutting contact with each other as shown in FIG. 12. In some other embodiments, the pressure sensors 420a-420l are separated from each other, and the space between adjacent two pressure sensors 420a-420l are smaller than a space between adjacent two contacts 127b. As such, all states of the contacts 127b can be inspected by the pressure sensors 420a-420l when the substrate 410 presses the contacts 127b. It is noted that the number of the pressure sensors shown in FIG. 12 is for illustrative purposes and should not limit the present disclosure. Embodiments fall within the present disclosure if the number of the pressure sensors is greater than one.

During the inspection process, the contact state inspection element 400 is disposed between the cone 160 and the cup 110. In other words, the cone 160 and the cup 110 together clamp the contact state inspection element 400. The contacts 127b of the cup 110 is in contact with the pressure sensors 420a-420l of the contact state inspection element 400, and the pressure sensors 420a-420l are disposed between the substrate 410 and the cup 110. When the cone 160 presses the contact state inspection element 400, the pressure sensors 420a-420l touches the contacts 127b. The pressure sensors 420a-420l begin to detect pressure forces when the cone 160 continuously press the contact state inspection element 400. The pressure sensors 420a-4201 can sense the states of the contacts 127b by comparing the sensed pressure forces with corresponding predetermined pressure values/ ranges. Since the details of the comparison and the determination of the predetermined pressure values/ranges of the contact state inspection element 400 are similar to that of the pressure sensors 130 as mentioned above, a description in this regard will not be repeated hereinafter. The pressure sensors 420a-4201 can be electrically connected to a feedback module 320. In some embodiments, the pressure sensors 420a-4201 are electrically connected to the feedback module 320 respectively through wires 430a-4301.

Figure 13:
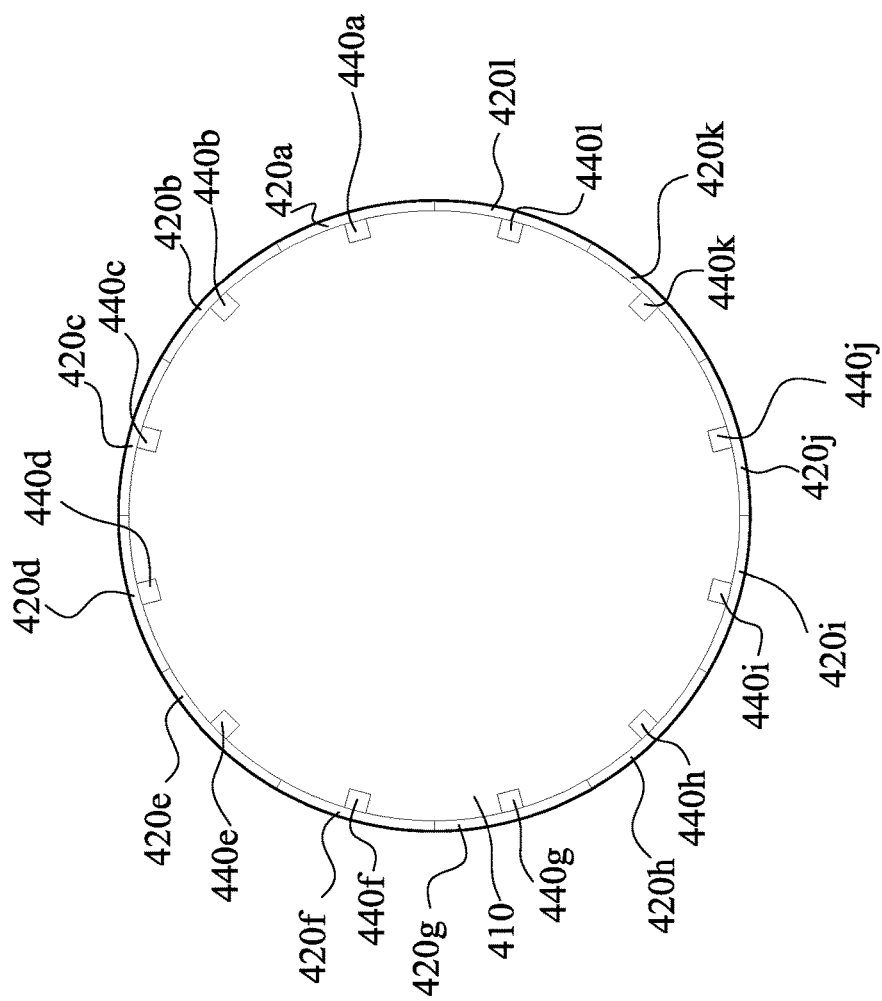
FIG. 13 is a bottom view of the contact state inspection element in accordance with some embodiments of the present disclosure.

FIG. 13 is a bottom view of the contact state inspection element 400 in accordance with some embodiments of the present disclosure. In some embodiments, the pressure sensors 420a-4201 are electrically connected to the feedback module 320 respectively through transmitters 440a-4401. The transmitters 440a-4401 transmit the pressure force data of the pressure sensors 420a-4201 to the feedback module 320. In some other embodiments, one or some of the pressure sensors 420a-4201 can be electrically connected to the feedback module 320 in a wireless manner, and the rest of the pressure sensors 420a-4201 are electrically connected to the feedback module 320 by using wires.

Figure 14:
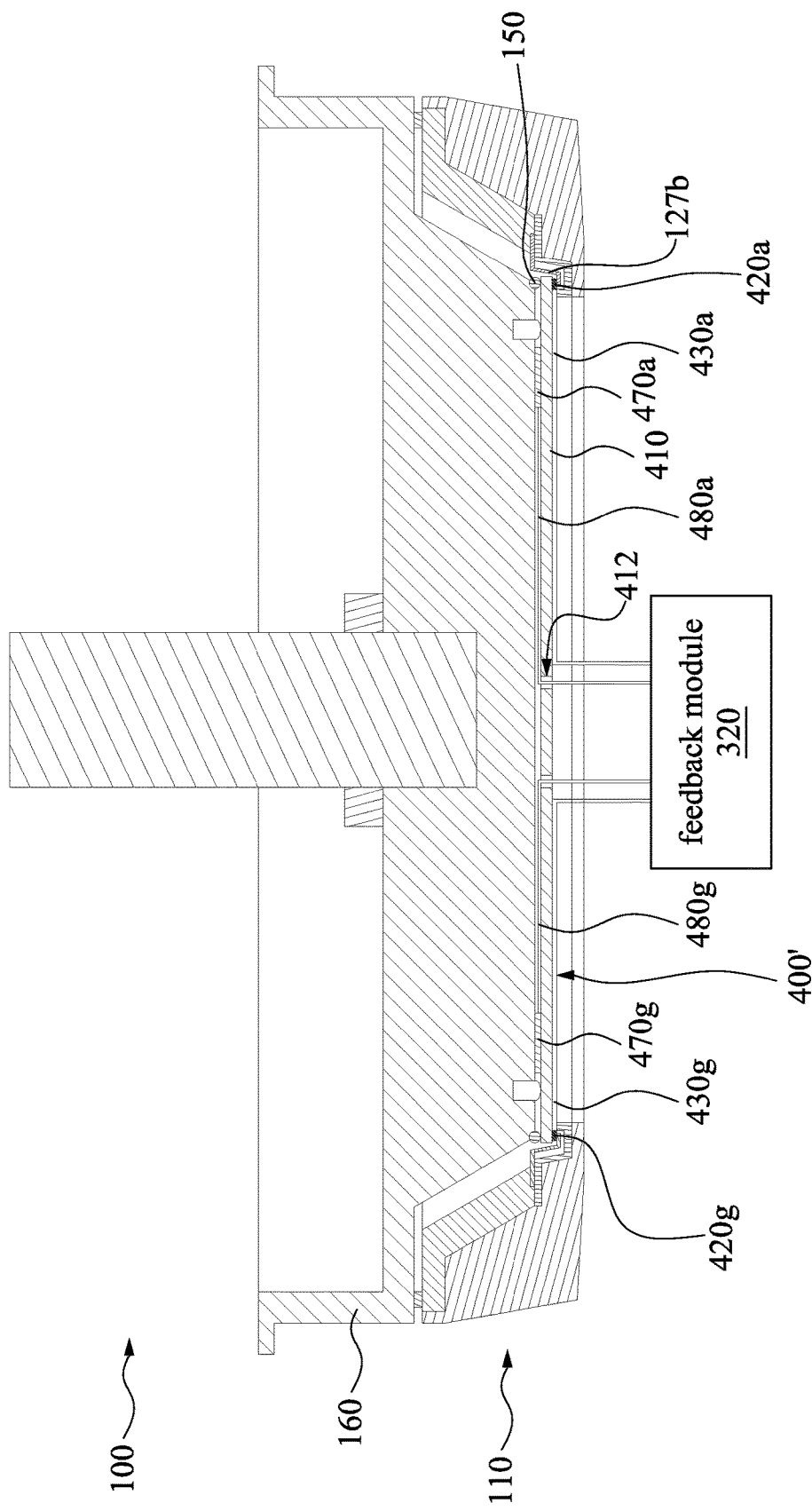
FIG. 14 is a cross-sectional view of the clamshell of FIG. 1 and a contact state inspection element in accordance with some embodiments of the present disclosure.
Figure 15A:
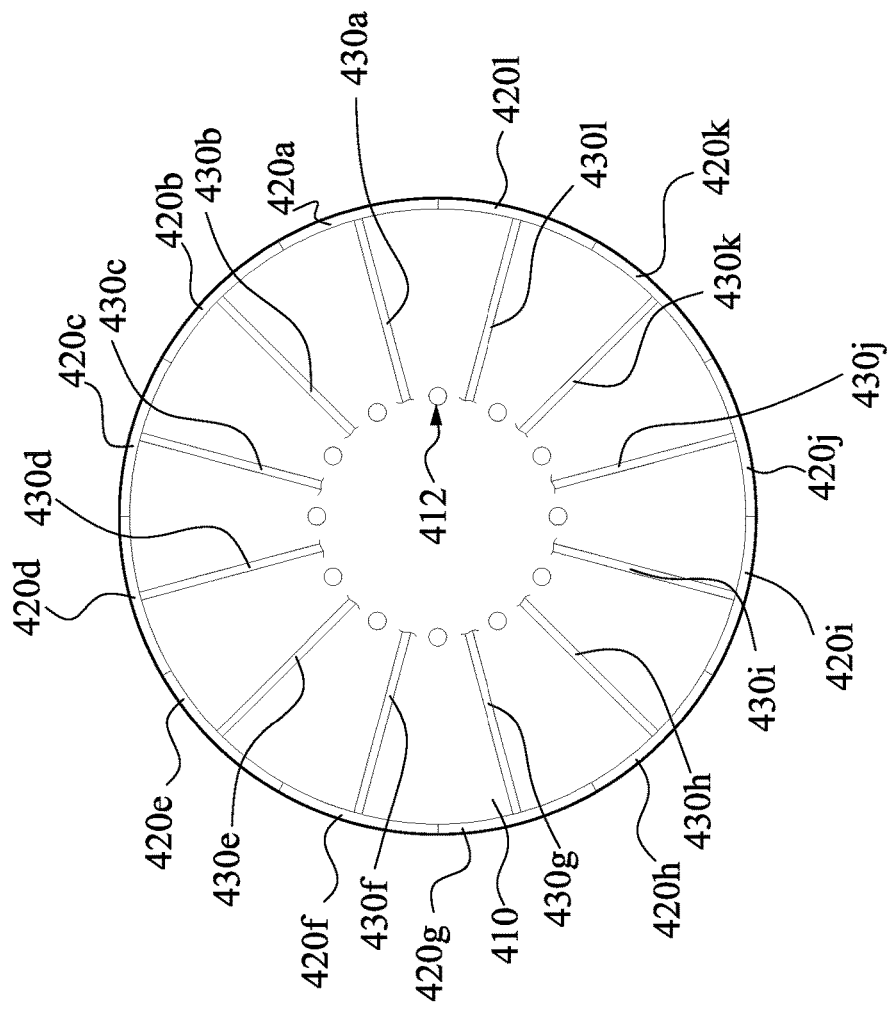
FIG. 15A is a bottom view of the contact state inspection element in FIG. 14.
Figure 15B:
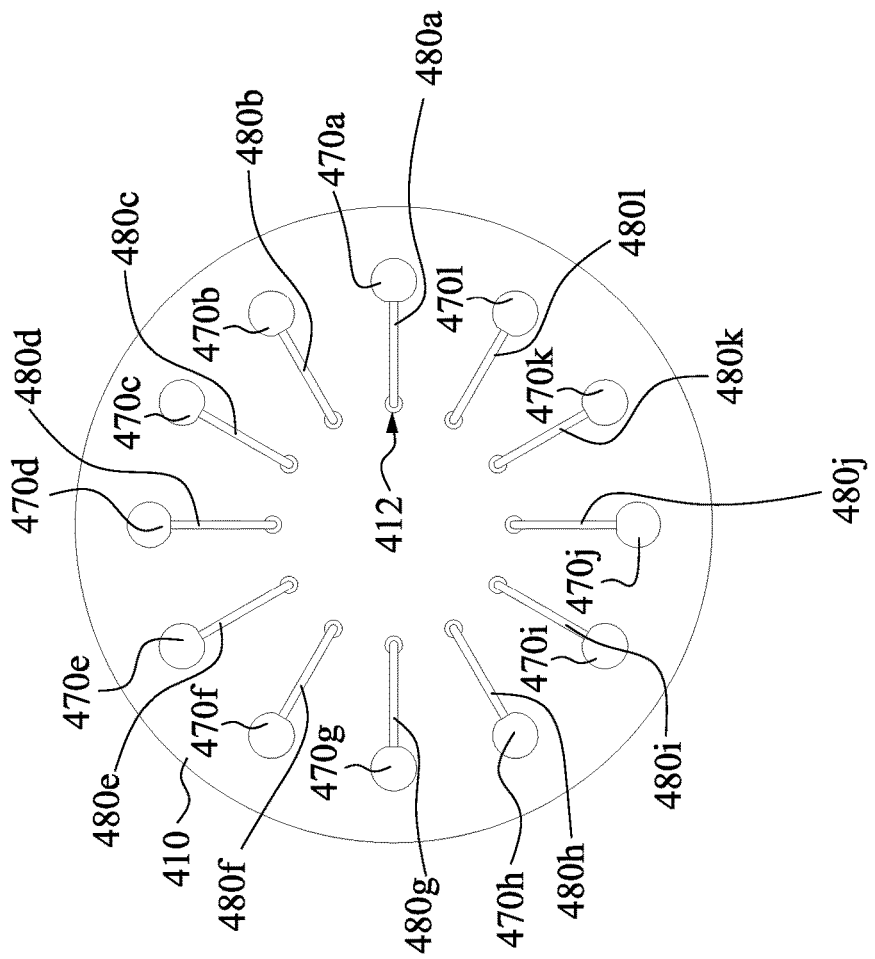
FIG. 15B is a top view of the pressure inspection element in FIG. 14.

FIG. 14 is a cross-sectional view of the clamshell 100 of FIG. 1 and a contact state inspection element 400' in accordance with some embodiments of the present disclosure, FIG. 15A is a bottom view of the contact state inspection element 400' in FIG. 14, and FIG. 15B is a top view of the pressure inspection element 400' in FIG. 14. Reference is made to FIGS. 14 and 15B. In some embodiments, the substrate 410 may be not flat when it is in the cup 110, and the substrate 410 may provide different pressure forces to different pressure sensors 420a-4201. Hence, the pressure forces sensed by the pressure sensors 420a-4201 may not only be contributed by the contact states, but also by the inclined substrate 410. As such, in some embodiments, the contact state inspection element 400' further includes a plurality of pressure sensors 470a-4701. The pressure sensors 470a-4701 are disposed between the substrate 410 and the cone 160 when the cone 160 and the cup 110 together clamp the contact state inspection element 400'. Further, the O-ring 150 surrounds the pressure sensors 470a-4701. The pressure sensors 470a-4701 are arranged as a circle. The pressure sensor 470a is opposite to the pressure sensor 470g, the pressure sensor 470b is opposite to the pressure sensor 470h, the pressure sensor 470c is opposite to the pressure sensor 470i, the pressure sensor 470d is opposite to the pressure sensor 470j, the pressure sensor 470e is opposite to the pressure sensor 470k, and the pressure sensor 470f is opposite to the pressure sensor 470l. In some embodiments, the pressure sensors 470a-4701 are substantially equidistant from each other. It is noted that the number of the pressure sensors shown in FIG. 17B is for illustrative purposes and should not limit the present disclosure. Embodiments fall within the present disclosure if the number of the pressure sensors is greater than one.

The pressure sensors at opposite positions (e.g., the pressure sensors 470a and 470g in FIG. 15B) will sense a huge different pressure forces if the wafer 90 is inclined at a large angle. Therefore, the feedback module 320 can further inspect the difference between the maximum and minimum pressure forces of the pressure sensors 470a-4701. The feedback module 320 will send a stop signal to a controller to stop the motion of the cone 160 if the difference value between the maximum and minimum pressure forces (e.g., the pressure forces of the pressure sensors 470a and 470g in this case) is higher than a predetermined difference value.

In some embodiments, if the difference between the maximum and minimum pressure forces of the pressure sensors 470a-4701 is in a predetermined pressure range, the substrate 410 will be considered as flat, and the pressure forces of the pressure sensors 420a-4201 reflect the states of the contacts 127b.

The pressure sensors 470a-4701 can be electrically connected to the feedback module 320. In some embodiments, the pressure sensors 470a-4701 are electrically connected to the feedback module 320 respectively through wires 480a-4801. In some embodiments, the substrate 460 further include a plurality of through holes 412, and the wires 480a-480d pass through the through holes 412 to connected to the feedback module 320. In some other embodiments, the pressure sensors 470a-4701 are electrically connected to the feedback module 320 respectively through transmitters. In some other embodiments, one or some of the pressure sensors 420a-4201 and 470a-470d can be electrically connected to the feedback module 320 in a wireless manner, and the rest of the pressure sensors 420a-4201 and 470a-470d are electrically connected to the feedback module 320 by using wires. Since other structural details of the contact state inspection element 400' are similar to the contact state inspection element 400 of FIG. 11, a description in this regard will not be repeated hereinafter.

Figure 16:
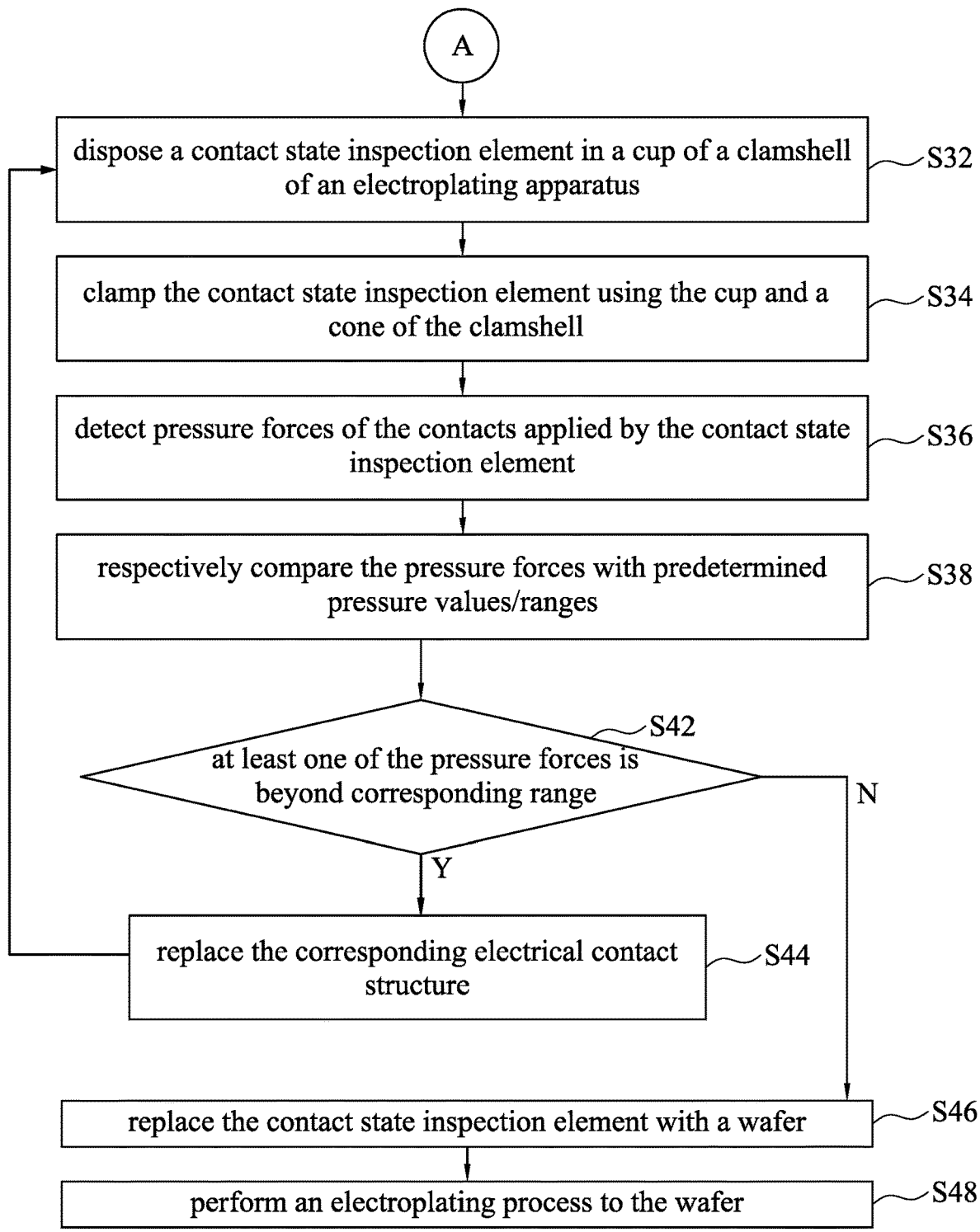
FIG. 16 is a flow chart of a method or inspecting the states of the contacts according to some embodiments.

FIG. 16 is a flow chart of a method M30 for inspecting the states of the contacts according to some embodiments. The method M30 is merely an example and is not intended to limit the present disclosure beyond what is explicitly recited in the claims. Additional operations can be provided before, during, and after the method M30, and some operations described can be replaced, eliminated, or moved around for additional embodiments of the process. For clarity and ease of explanation, some elements of the figures have been simplified.

Method M30 includes operation S32: disposing a contact state inspection element in a cup of a clamshell of an electroplating apparatus. The contact state inspection elements 400 and 400' respectively shown in FIGS. 11 and 14 can be applied in this embodiment. Furthermore, in some embodiments, the pressure inspection element may be inclined if the wafer centering mechanism (see FIG. 5) of the cup does not function well, e.g., the wafer centering mechanism may be twisted and make the contact state inspection element in the wrong position.

The method M30 of FIG. 16 further includes operation S34: clamping the contact state inspection element using the cup and a cone of the clamshell. In some embodiments, as shown in FIG. 11, the cone 160 presses the contact state inspection element 400 downwardly, such that the cone 160 and the cup 110 together clamp the contact state inspection element 400.

The method M30 of FIG. 16 further includes operation S36: detecting pressure forces of the contacts applied by the contact state inspection element. In some embodiments, the method M30 detects the pressure forces applied by the substrate of the contact state inspection element against the contacts, and the pressure forces of the contacts are detected by the pressure sensors 420a-4201 in FIG. 12 or 15A.

The method M30 of FIG. 16 further includes operation S38: comparing the detected pressure forces with predetermined values. In some embodiments, each of the pressure sensors 420 has a predetermined pressure value/range, which represents a pressure force applied by good-state contacts. When the wafer presses the contacts, each of the pressure sensors senses a pressure force. The feedback module receives the pressure forces of the pressure sensors and compare these pressure forces with the predetermined pressure values/ranges.

The method M30 of FIG. 16 further includes operation S42: the feedback module will provide a notification when the pressure force of at least one of the pressure sensors is beyond the corresponding predetermined pressure range. The notification indicates which pressure sensor senses the smaller pressure force, and an operator can identify which electrical contact structure is going to be replaced.

The method M30 of FIG. 16 further includes operation S44: the corresponding electrical contact structure is replaced with another electrical contact structure. For example, the cone of the clamshell is lifted, and the contact state inspection element is removed from the clamshell. The cup is dissembled to replace the electrical contact structure (with bad contact(s)). After the electrical contact structure is replaced, the cup is assembled again. The method M30 is back to the operation S32.

In some other embodiments, if all the pressure force of the pressure sensors 420 are in the corresponding predetermined pressure value/range, then the operation S32 moves to the operation S46: replacing the contact state inspection element with a wafer. As such, the states of the contacts can be inspected before the wafer is placed in the clamshell.

In some embodiments, the method M30 further includes operation S48: performing an electroplating process to the wafer. For example, the clamshell with the wafer can be disposed in the plating solution of the plating bath to process the electroplating process. With such inspection method, the clamshell can permit the contacts are in good contact with the wafer in advance, and the yield of the wafer can be improved.

Figure 17:
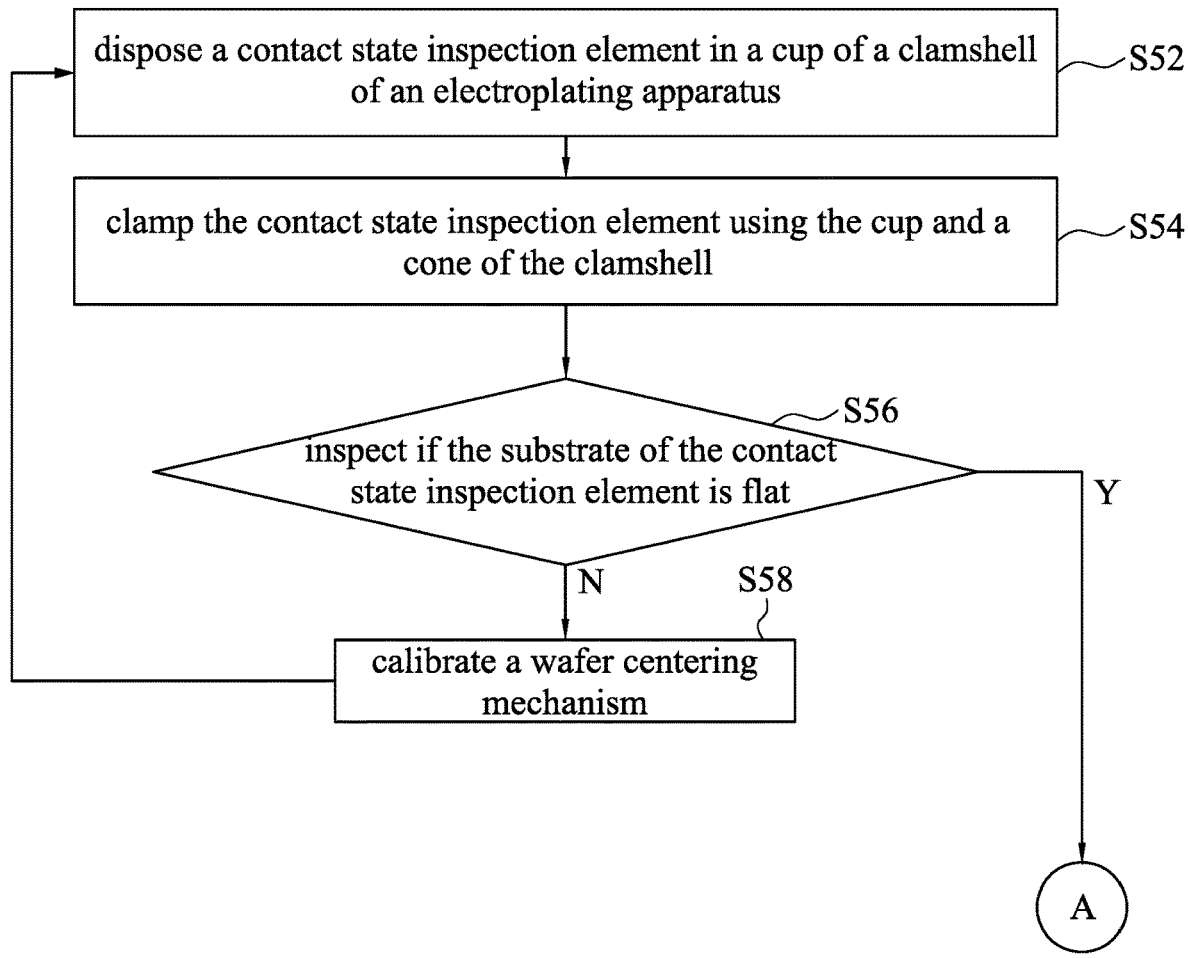
FIG. 17 is a flow chart of a method or inspecting the states of the contacts according to some embodiments.

FIG. 17 is a flow chart of a method M30' for inspecting the states of the contacts according to some embodiments. The method M30' is merely an example and is not intended to limit the present disclosure beyond what is explicitly recited in the claims. Additional operations can be provided before, during, and after the method M30, and some operations described can be replaced, eliminated, or moved around for additional embodiments of the process. For clarity and ease of explanation, some elements of the figures have been simplified.

Method M30' includes operation S52: disposing a contact state inspection element in a cup of a clamshell of an electroplating apparatus; operation S54: clamping the contact state inspection element using the cup and a cone of the clamshell; operation S56: inspect if the substrate of the contact state inspection element is flat. For example, the pressure sensors 470a-470l in FIGS. 16 and 17 can be used to inspect the flatness of the substrate, and a description in this regard will not be repeated hereinafter.

If the substrate is not flat, then the wafer centering mechanism of the clamshell is calibrated to allow the contact state inspection element in the correct position (operation S58). If the substrate is flat, the proceeds the operation S12 (FIG. 16). As such, the flatness factor of the substrate 410 can be expelled from the inspection data of the pressure sensors 470a-470l.

Figure 18:
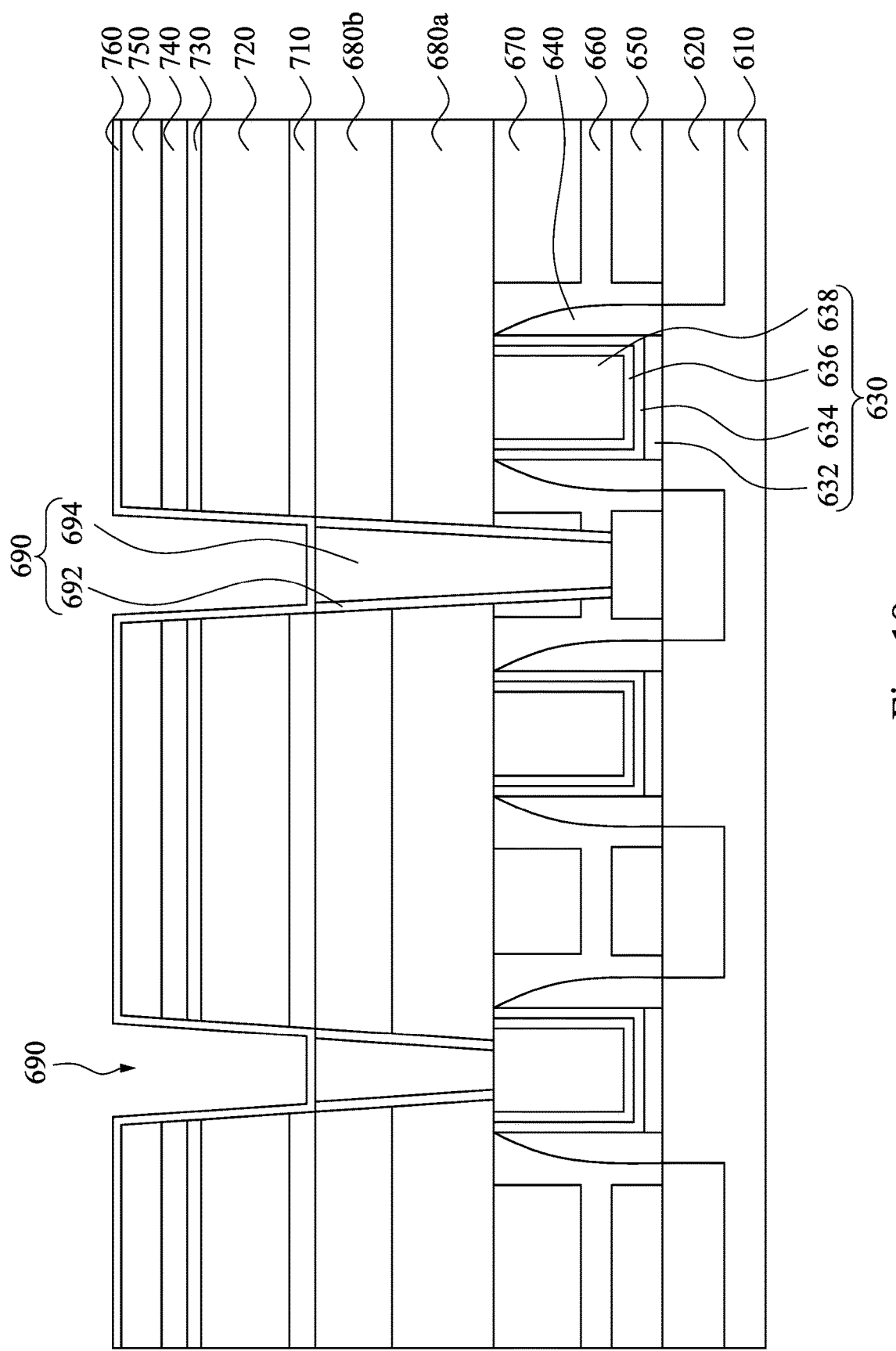
FIGS. 18-20 are cross-sectional diagrams illustrating an electroplating method of fabricating a dual damascene interconnect structure in accordance with various aspects of the present disclosure.
Figure 19:
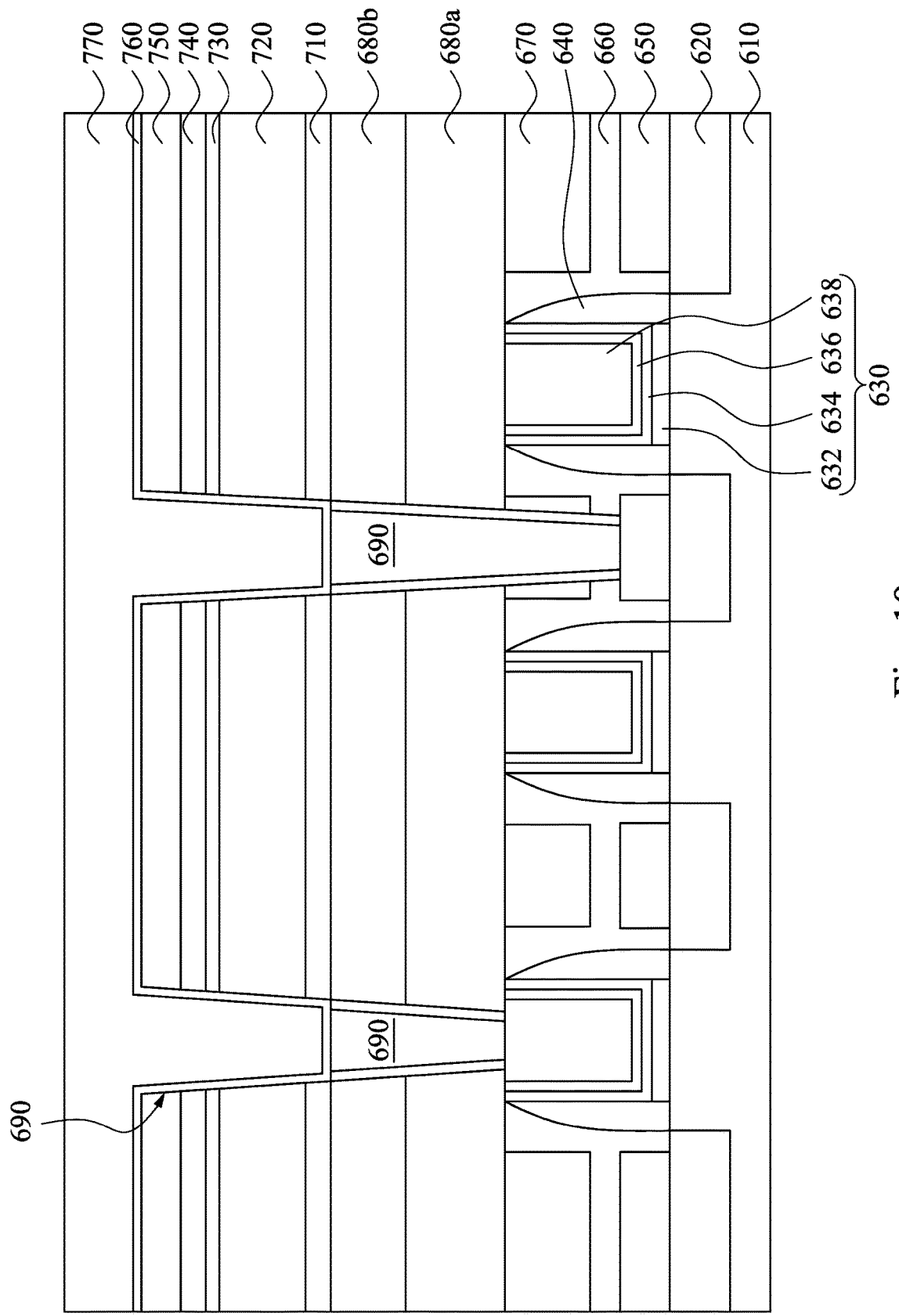
Figure 20:
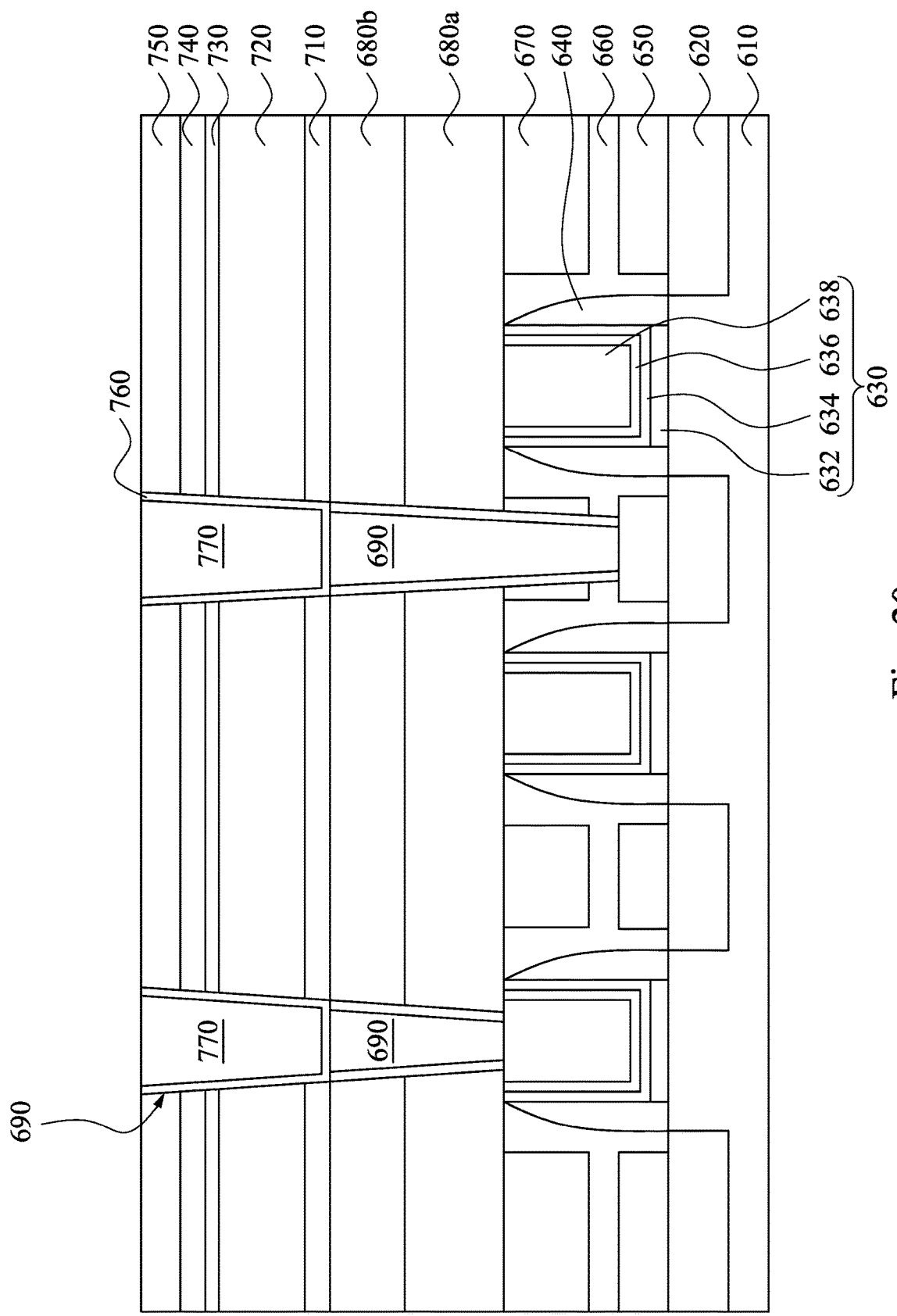

FIGS. 18-20 are cross-sectional diagrams illustrating an electroplating method of fabricating a dual damascene interconnect structure in accordance with various aspects of the present disclosure. In some embodiments, the method includes physical vapor deposition of a barrier layer over the feature surfaces, and a conductive metal seed layer, such as copper, over the barrier layer, followed by electroplating a conductive metal, such as copper, over the seed layer to fill the interconnect structure/feature. Following, the deposited layers and the dielectric layers may be planarized, e.g., by chemical mechanical polishing (CMP), to define a conductive interconnect feature.

Reference is made to FIG. 18. A substrate 610 is provided. A plurality of source/drain features 620 are formed in the substrate 610. A plurality of gate structures 630 are formed on the substrate 610 and between the adjacent source/drain features 620. In some embodiments, the gate structure 630 includes a gate dielectric layer 632, a high-k dielectric layer 634, at least one metal layer 636, and a filling metal 638. A spacer structure 640 surrounds the gate structure 630. Metal alloy layers 650 are respectively formed on the source/drain features 620. A contact etching stop layer (CESL) 660 is formed to cover the gate structure 630, the spacer structure 640, and the metal alloy layers 650. An interlayer dielectric (ILD) 670 is formed on the CESL 660.

The substrate 610 may be made of semiconductor materials such as silicon. The source/drain features 620 may be doped region in the substrate 610 or may be epitaxial layers. The gate dielectric layer 632, the spacer structure 640, the CESL 660, and the ILD 670 may be made of dielectric materials. The filling metal 638 may be made of Al or other suitable materials. The metal alloy layers 650 may be a silicide layer (e.g., NiSi). It is noted that the materials mentioned above are illustrative and should not limit the present disclosure.

Furthermore, a plurality of ILDs 680a and 680b are formed on the ILD 670 and the CESL 660. Subsequently, a plurality of contacts 690 are formed in the ILDs 680a and 680b and respectively in contact with the gate structure 630 and the metal alloy layer 650. The contact 690 includes an adhesive layer 692 and a filling metal 694 disposed on the adhesive layer 692. The ILD 680a may be made of tetra-ethyl-ortho-silicate (TEOS), and the ILD 680b may be made of high density plasma (HDP) phosphor-silicate glass (PSG). The contacts 690 may be made of tungsten. It is noted that the materials mentioned above are illustrative and should not limit the present disclosure.

Then, a barrier layer 710, an extreme low-k dielectric layer 720, an extreme super low-k dielectric layer 730, an anti-reflective layer 740, and a dielectric layer 750 are sequentially formed on the ILD 680b and the contacts 690. Subsequently, a plurality of openings 705 are formed in the layers 720-750 to respectively expose the contacts 690. Then, a barrier layer 760 is conformally formed in the openings 705 and on the dielectric layer 750. The barrier layer 710 may be made of SiC and may be an oxygen barrier coating (OBC), the anti-reflective layer 740 may be a nitrogen free anti-reflection layer, and the barrier layer 760 may be made of TiN. It is noted that the materials mentioned above are illustrative and should not limit the present disclosure.

Reference is made to FIG. 19. A conductive layer 770 such as a copper layer is electroplated over the barrier layer 760 to metalize the dual damascene structure. The conductive layer 770 electrochemically deposited by the electroplating apparatus 10 with controlled plating current or voltage in accordance with various aspects of the present disclosure. In some embodiments, prior to the electroplating, the wafer of FIG. 19 is disposed in the electroplating apparatus 10 (see FIG. 1), and an inspection process mentioned above is performed. Then, the states of contacts are determined based on the detected pressure forces data. In alternative embodiments, the pressure forces may be determined or obtained in real time while electroplating, and the pressure forces may be adjusted in real time based on the determined or obtained pressure forces. In some embodiments, the present disclosure provides for an electroplating process substantially with good electrical current providing.

Reference is made to FIG. 20. The top portion of the processed substrate, i.e., the exposed electroplated conductive layer 770 (shown in FIG. 19), may then be planarized, for example by chemical mechanical polishing (CMP). During planarization, portions of the barrier layer 760, the conductive layer 770, and a top surface of the dielectric layer 750 are removed from the top surface of the substrate 610, leaving a planar surface with conductive interconnect features, such as a dual damascene structure.

According to some embodiments, a contact state inspection process is performed before or during the electroplating process. The contact state inspection process can permit the contacts are in good contact with the wafer. Furthermore, a contact state inspection element can be disposed in the clamshell to inspect the states of the contacts.

In this document, the term "module" as used herein, refers to software, firmware, hardware, and any combination of these elements for performing the associated functions described herein. Additionally, for purpose of discussion, the various modules are described as discrete modules; however, as would be apparent to one of ordinary skill in the art, two or more modules may be combined to form a single module that performs the associated functions according embodiments of the disclosure.

A person of ordinary skill in the art would further appreciate that any of the various illustrative logical blocks, modules, processors, means, circuits, methods and functions described in connection with the aspects disclosed herein can be implemented by electronic hardware (e.g., a digital implementation, an analog implementation, or a combination of the two), firmware, various forms of program or design code incorporating instructions (which can be referred to herein, for convenience, as "software" or a "software module), or any combination of these techniques. To clearly illustrate this interchangeability of hardware, firmware and software, various illustrative components, blocks, modules, circuits, and steps have been described above generally in terms of their functionality. Whether such functionality is implemented as hardware, firmware or software, or a combination of these techniques, depends upon the particular application and design constraints imposed on the overall system. Skilled artisans can implement the described functionality in various ways for each particular application, but such implementation decisions do not cause a departure from the scope of the present disclosure.

Furthermore, a person of ordinary skill in the art would understand that various illustrative logical blocks, modules, devices, components and circuits described herein can be implemented within or performed by an integrated circuit (IC) that can include a general purpose processor, a digital signal processor (DSP), an application specific integrated circuit (ASIC), a field programmable gate array (FPGA) or other programmable logic device, or any combination thereof. The logical blocks, modules, and circuits can further include antennas and/or transceivers to communicate with various components within the network or within the device. A general purpose processor can be a microprocessor, but in the alternative, the processor can be any conventional processor, controller, or state machine. A processor can also be implemented as a combination of computing devices, e.g., a combination of a DSP and a microprocessor, a plurality of microprocessors, one or more microprocessors in conjunction with a DSP core, or any other suitable configuration to perform the functions described herein.

According to some embodiments, a method includes disposing a wafer in a cup of a clamshell of an electroplating apparatus. The wafer is clamped using the cup and a cone of the clamshell. First pressure forces of contacts of the cup applied by the wafer is detected. The first pressure forces are respective compared with corresponding predetermined pressure ranges.

In some embodiments, the method further includes replacing at least one of the contacts when at least one of the first pressure forces is beyond the corresponding predetermined pressure range.

In some embodiments, the method further includes repeating disposing the wafer in the cup, clamping the wafer, detecting first pressure forces of contacts, and respectively comparing the first pressure forces with corresponding predetermined pressure ranges after replacing the at least one of the contacts.

In some embodiments, the method further includes performing an electroplating process on the wafer when the first pressure forces are respectively in the corresponding predetermined pressure ranges.

In some embodiments, the method further includes determining the corresponding predetermined pressure range.

In some embodiments, determining the corresponding predetermined pressure range includes providing an electrical signal to the contacts; and inspecting a feedback electrical signal of the contacts.

In some embodiments, determining the corresponding predetermined pressure range further includes detecting second pressure forces of contacts of the cup applied by the wafer when the feedback electrical signal is in a standard feedback electrical range, and the second pressure forces are the corresponding predetermined pressure ranges.

In some embodiments, the feedback electrical signal is an electrical resistance of the contacts.

According to some embodiments, a method includes disposing a contact state inspection element in a cup of a clamshell of an electroplating apparatus. The contact state inspection element includes a substrate and a plurality of pressure sensors on the substrate. The contact state inspection element is clamped using the cup and a cone of the clamshell. First pressure forces of the contacts applied by the contact state inspection element are detected. The first pressure forces are compared with corresponding predetermined pressure ranges. The contact state inspection element is replaced with a wafer after comparing the detected first pressure forces with the corresponding predetermined pressure ranges.

In some embodiments, detecting the first pressure forces includes detecting the first pressure forces between the contacts and the substrate of the contact state inspection element.

In some embodiments, the method further includes performing an electroplating process to the wafer.

In some embodiments, the method further includes inspecting flatness of the substrate of the contact state inspection element prior to detecting pressure forces of the contacts.

In some embodiments, inspecting flatness of the substrate includes detecting second pressure forces in different regions between the cone and the substrate of the contact state inspection element.

In some embodiments, the method further includes calibrating a wafer centering mechanism of the clamshell when a difference between two of the second pressure forces is higher than the predetermined value.

In some embodiments, the method further includes repeating disposing the contact state inspection element in the cup after calibrating the wafer centering mechanism.

According to some embodiments, a device for an electroplating apparatus includes a cup, a cone, and a feedback module. The cup is configured to support a wafer. The cup includes a plurality of contacts, a seal, and a plurality of pressure sensors. The seal is under the contacts. The pressure sensors are between the contacts and the seal. The cone is over the cup and is configured to clamp the wafer with the cup. The feedback module is electrically communicated with the pressure sensors to receive and analyze pressure forces detected by the pressure sensors.

In some embodiments, the pressure sensors are arranged as a circle.

In some embodiments, the pressure sensors are in abutting contact with each other.

In some embodiments, the pressure sensors have substantially the same sensing area.

In some embodiments, the pressure sensors have different sensing areas.

The foregoing outline s features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    disposing a first wafer in a cup of a clamshell of an electroplating apparatus;
    clamping the first wafer using the cup and a cone of the clamshell;
    detecting a first pressure force of a contact of the cup applied by the first wafer; and
    comparing the first pressure force of the contact with a corresponding predetermined pressure range that is determined prior to disposing the first wafer in the cup.

2. The method of claim 1, further comprising performing an electroplating process on the first wafer when the first pressure force is in the corresponding predetermined pressure range.

3. The method of claim 1, further comprising determining the corresponding predetermined pressure range.

4. The method of claim 3, wherein determining the corresponding predetermined pressure range comprises:
    clamping a second wafer using the cup and a cone of the clamshell prior to disposing the first wafer in the cup;
    providing an electrical signal to the contact; and
    inspecting a feedback electrical signal of the contact.

5. The method of claim 4, wherein determining the corresponding predetermined pressure range further comprises:
    detecting a second pressure force of a contact of the cup applied by the second wafer when the feedback electrical signal is in a standard feedback electrical range, and the second pressure force is the corresponding predetermined pressure range.

6. The method of claim 4, wherein the feedback electrical signal is an electrical resistance of the contact.

7. The method of claim 1, wherein comparing the first pressure force with the corresponding predetermined pressure range is performed during an electroplating process of the electroplating apparatus.

8. The method of claim 1, further comprising performing an electroplating process on the first wafer after detecting the first pressure force of the contact of the cup.

9. A method, comprising:
    disposing a contact state inspection element in a cup of a clamshell of an electroplating apparatus, wherein the contact state inspection element comprises a substrate and a plurality of pressure sensors on the substrate;
    clamping the contact state inspection element using the cup and a cone of the clamshell;
    detecting first pressure forces of contacts of the cup applied by the contact state inspection element; and
    comparing the first pressure forces of the contacts with corresponding predetermined pressure ranges that are determined prior to disposing the contact state inspection element in the cup.

10. The method of claim 9, wherein detecting the first pressure forces comprises detecting the first pressure forces between the contacts and the substrate of the contact state inspection element.

11. The method of claim 9, further comprises:
    removing the contact state inspection element from the electroplating apparatus;
    disposing a wafer in the cup after removing the contact state inspection element when the first pressure forces are in the corresponding predetermined pressure ranges; and
    performing an electroplating process to the wafer.

12. The method of claim 9, further comprising inspecting flatness of the substrate of the contact state inspection element prior to detecting pressure forces of the contacts.

13. The method of claim 12, wherein inspecting flatness of the substrate comprises:
    detecting second pressure forces in different regions between the cone and the substrate of the contact state inspection element.

14. The method of claim 13, further comprising calibrating a wafer centering mechanism of the clamshell when a difference between two of the second pressure forces is higher than a predetermined value.

15. The method of claim 14, further comprising repeating disposing the contact state inspection element in the cup after calibrating the wafer centering mechanism.

16. A method, comprising:
    disposing a contact state inspection element in a cup of a clamshell of an electroplating apparatus, wherein the contact state inspection element comprises a substrate and a plurality of pressure sensors on the substrate;
    clamping the contact state inspection element using the cup and a cone of the clamshell;
    detecting first pressure forces in different regions between the cone and the substrate of the contact state inspection element; and
    calibrating a wafer centering mechanism of the clamshell when a difference between two of the first pressure forces is higher than a predetermined value.

17. The method of claim 16, wherein detecting the first pressure forces in the different regions of the contact state inspection element is performed to detect the first pressure forces in opposite regions of the contact state inspection element.

18. The method of claim 16, further comprising removing the contact state inspection element from the electroplating apparatus after detecting the first pressure forces and prior to calibrating the wafer centering mechanism.

19. The method of claim 18, further comprising:
after removing the contact state inspection element, disposing a wafer in the cup of the clamshell of the electroplating apparatus; and
performing an electroplating process to the wafer.

20. The method of claim 16, further comprising:
detecting second pressure forces of contacts of the cup applied by the contact state inspection element; and
comparing the second pressure forces of the contacts with the predetermined value.

* * * * *